United States Patent
Sousa

(10) Patent No.: US 12,328,555 B2
(45) Date of Patent: Jun. 10, 2025

(54) FLUX BEAMFORMING

(71) Applicant: Joseph Luis Sousa, Billerica, MA (US)

(72) Inventor: Joseph Luis Sousa, Billerica, MA (US)

( * ) Notice: Subject to any disclaimer, the term of this patent is extended or adjusted under 35 U.S.C. 154(b) by 211 days.

(21) Appl. No.: 17/932,870

(22) Filed: Sep. 16, 2022

(65) Prior Publication Data

US 2023/0088140 A1 Mar. 23, 2023

Related U.S. Application Data

(60) Provisional application No. 63/261,399, filed on Sep. 20, 2021.

(51) Int. Cl.
*H04R 3/00* (2006.01)
*G01R 33/02* (2006.01)

(52) U.S. Cl.
CPC ............. *H04R 3/005* (2013.01); *G01R 33/02* (2013.01); *H04R 2410/01* (2013.01); *H04R 2430/23* (2013.01)

(58) Field of Classification Search
CPC ...... H04W 64/00; H04W 84/18; H04B 5/263; H04B 5/48; H04B 5/72; H04R 1/406; H04R 2201/401; H04R 2201/405; H04R 2410/01; H04R 2430/20; H04R 2430/23; H04R 3/005; H04N 23/673; H04N 23/676; H04N 23/959
USPC .............................................. 381/92, 56–59
See application file for complete search history.

(56) References Cited

U.S. PATENT DOCUMENTS

| | | | |
|---|---|---|---|
| 5,581,620 A | 12/1996 | Brandstein et al. | |
| 2003/0161485 A1* | 8/2003 | Smith | G01V 1/006 |
| | | | 381/91 |
| 2018/0040950 A1* | 2/2018 | Lee | H01Q 1/526 |
| 2021/0058702 A1* | 2/2021 | Shumard | H04R 19/04 |
| 2021/0152946 A1* | 5/2021 | Benattar | H04R 25/554 |

FOREIGN PATENT DOCUMENTS

| | | | | |
|---|---|---|---|---|
| EP | 2848007 A1 | 3/2015 | | |
| WO | 2848007 A1 * | 3/2015 | ............... | H04R 3/00 |

OTHER PUBLICATIONS

BoE., "DifferentialMicrophoneArrays," Master'sThesis, GrazUniversityofTechnology, pp. 1-102(2013).*
Messner, E., "Differential Microphone Arrays," Master's Thesis, Graz University of Technology, pp. 1-102 (2013).
International Search Report and Written Opinion for PCT/US2022/076537 dated Jan. 2, 2023.

* cited by examiner

*Primary Examiner* — Lun-See Lao
(74) *Attorney, Agent, or Firm* — Hamilton, Brook, Smith & Reynolds, P.C.

(57) ABSTRACT

A flux beam is generated as a function of flux magnitude patterns. A plurality of flux signals is detected via a sensor array comprising a plurality of sensors. A plurality of flux patterns is generated based on the plurality of flux signals, each of the plurality of flux patterns representing a respective one of the plurality of flux signals. A plurality of flux magnitude patterns is generated based on the plurality of flux patterns, each of the plurality of flux magnitude patterns representing an absolute value of a respective one of the plurality of flux patterns. A flux beam is then generated as a function of the plurality of flux magnitude patterns.

31 Claims, 44 Drawing Sheets
(40 of 44 Drawing Sheet(s) Filed in Color)

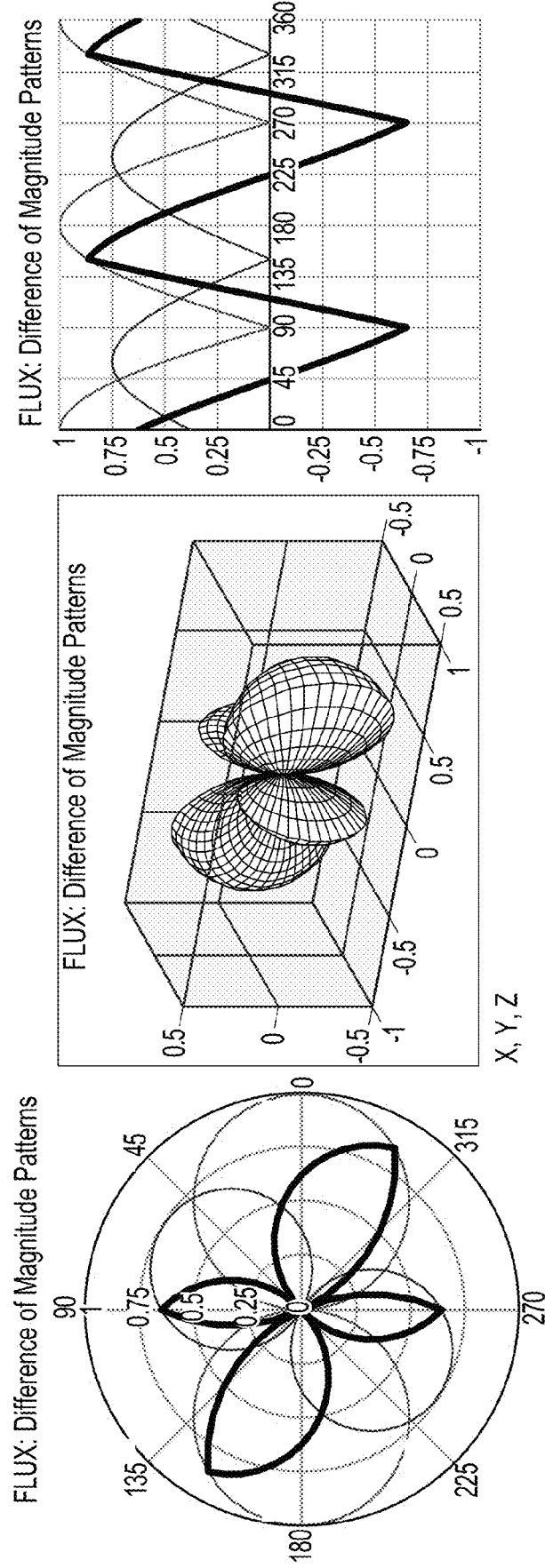

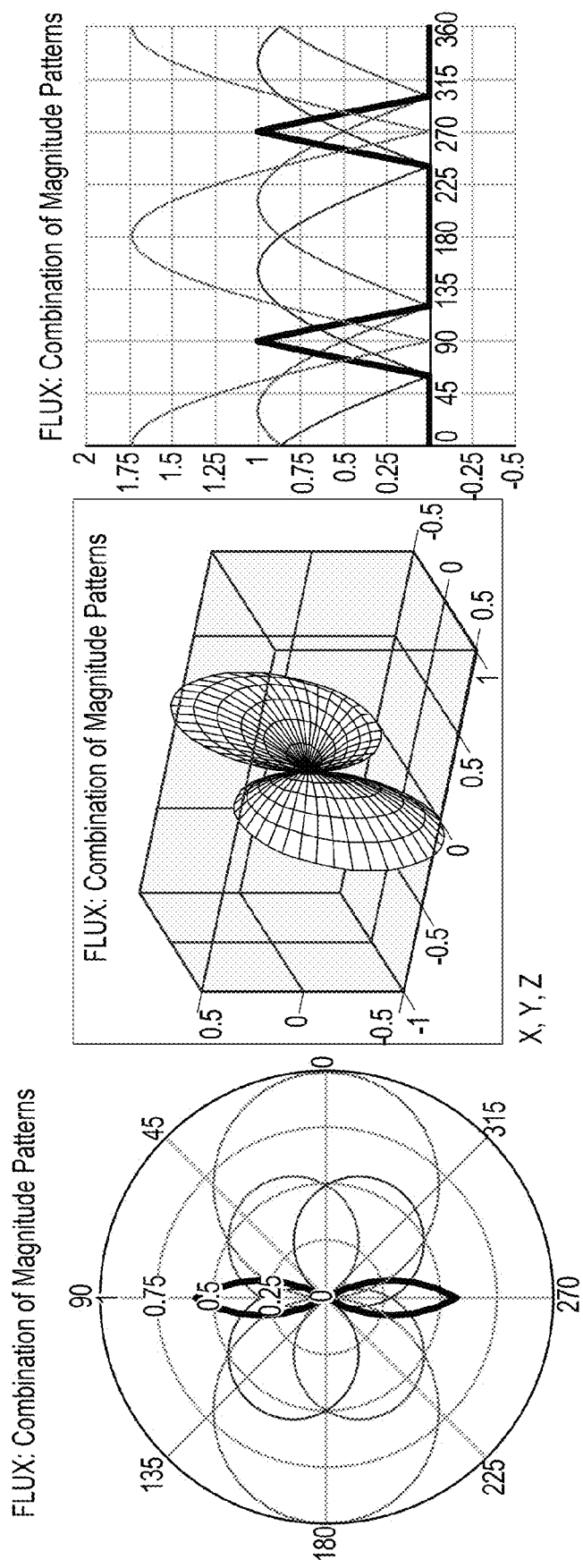

B1 and B2 represent quantities of signal from the omnidirectional pressure microphone B1=cos(50°)   B2=cos(30°)

$|\cos(\theta) + B1| - |\cos(\theta) + B2| + B2 - B1$

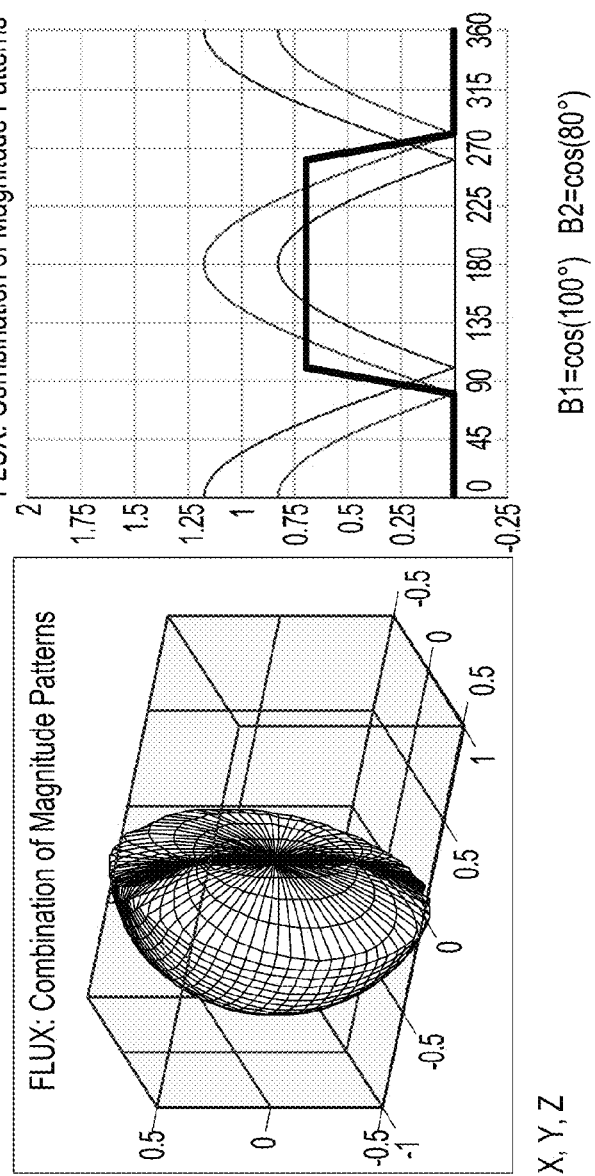
FIG. 11C
FIG. 11B
B1 and B2 represent quantities of signal from the omnidirectional pressure microphone
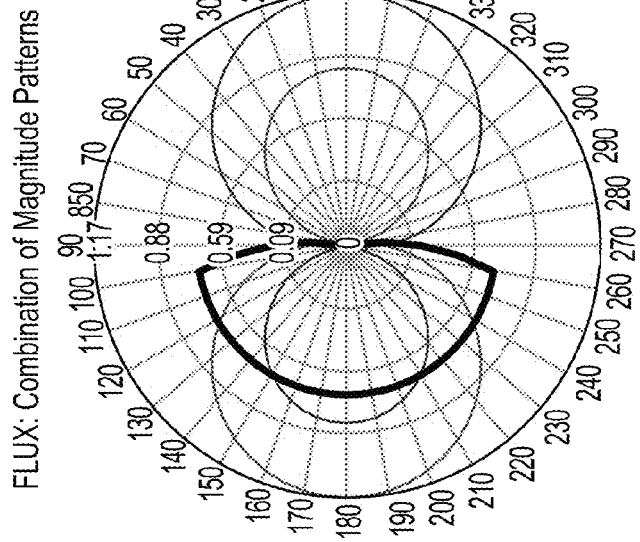
B1=cos(100°)  B2=cos(80°)
|cos(θ) + B1| - |cos(θ) + B2| + B2 - B1
FIG. 11A

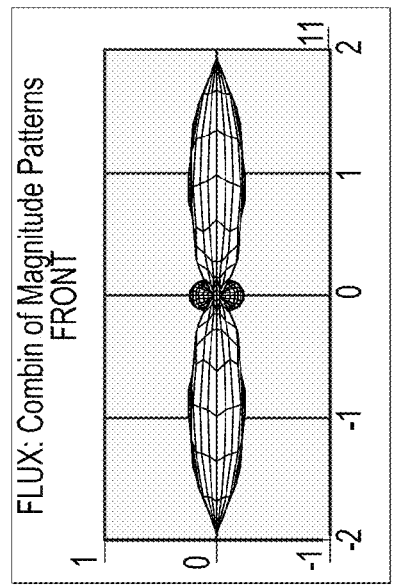
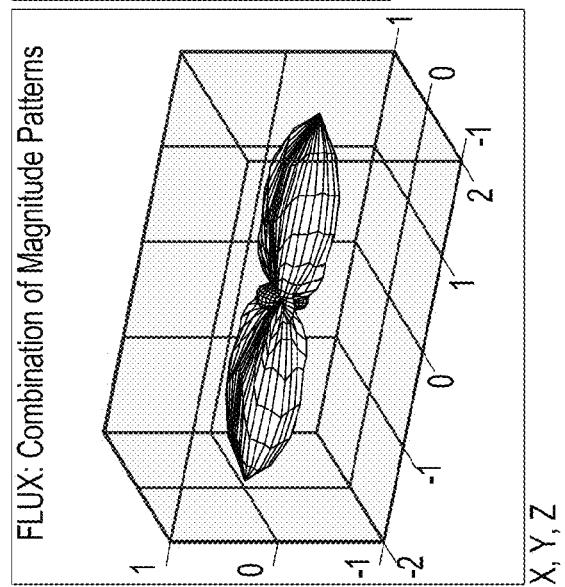
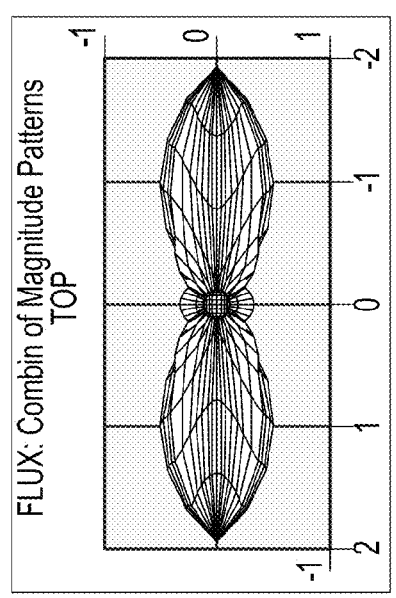
FIG. 16C
FIG. 16B
FIG. 16A

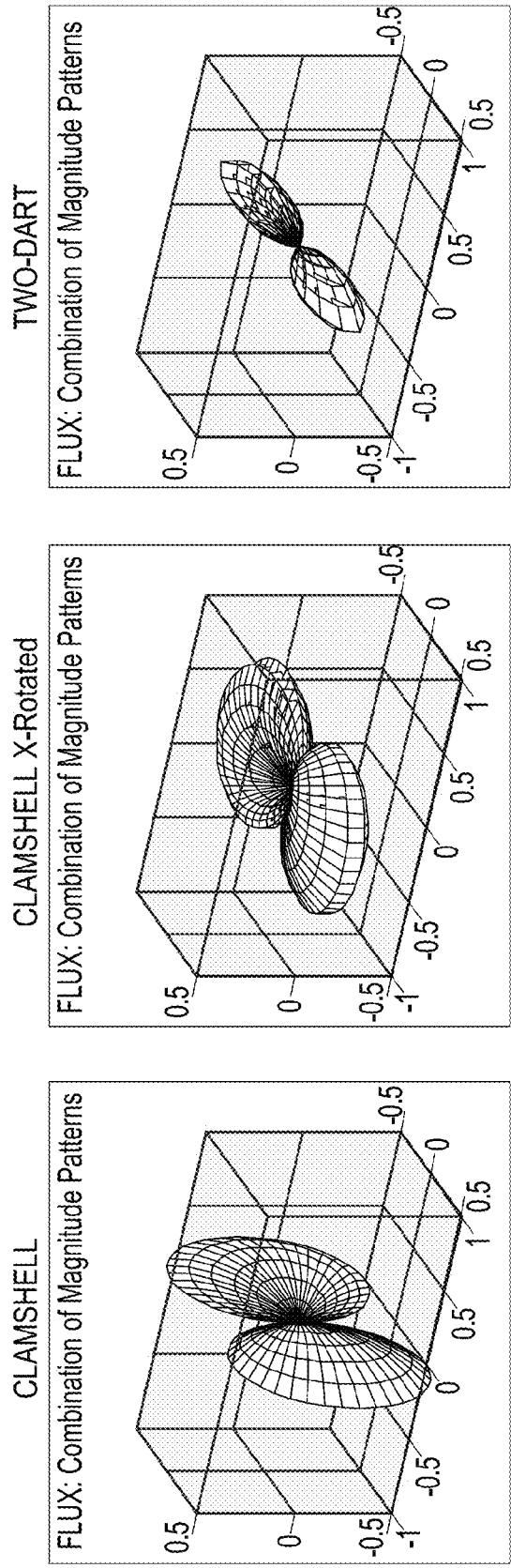
FIG. 17A
FIG. 17B
FIG. 17C
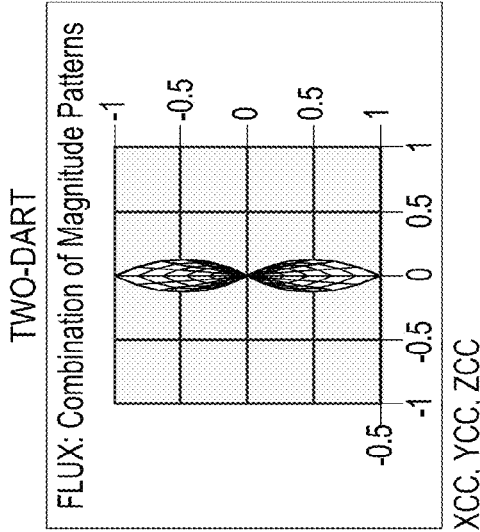
FIG. 17E
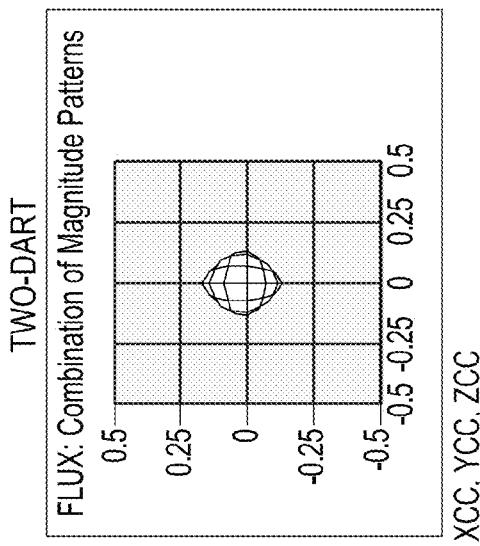
FIG. 17D

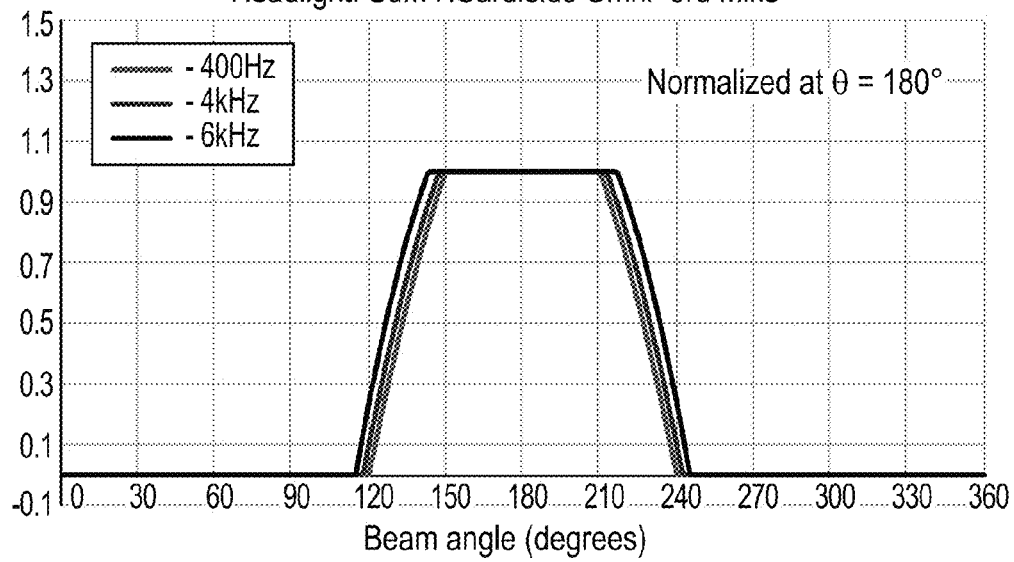
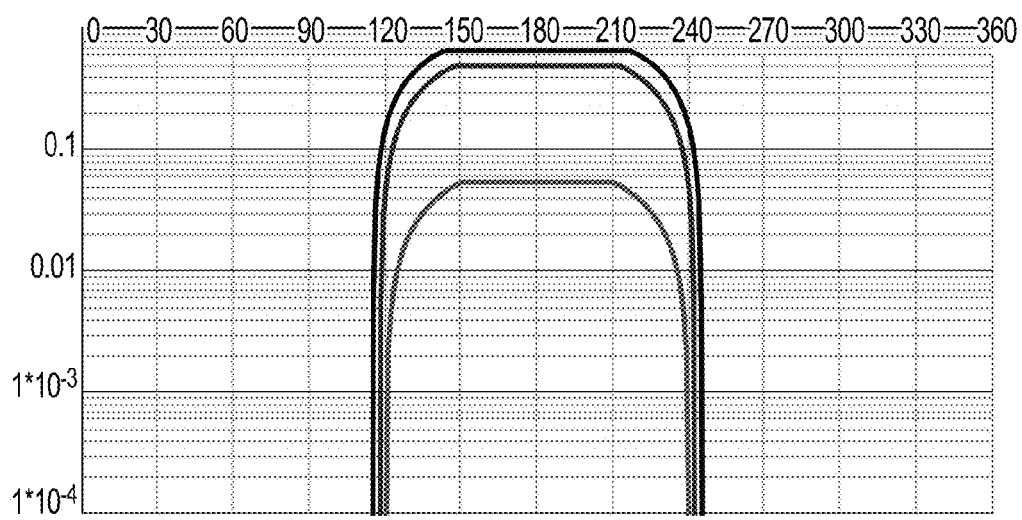
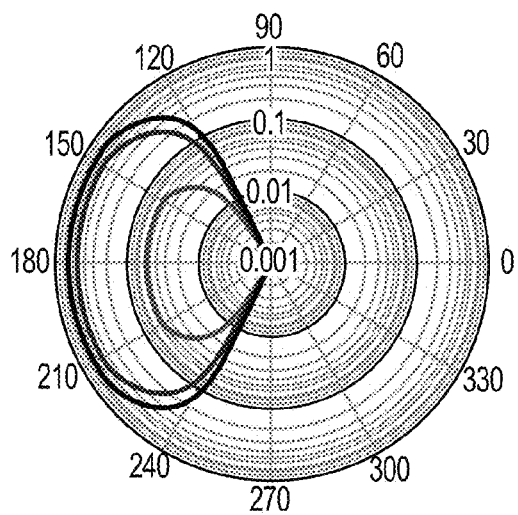
FIG. 25

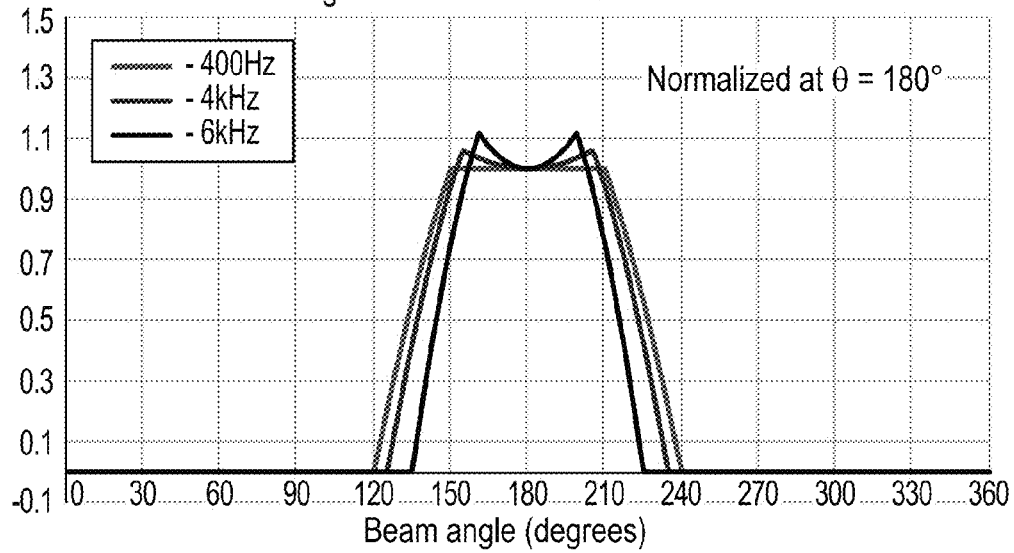
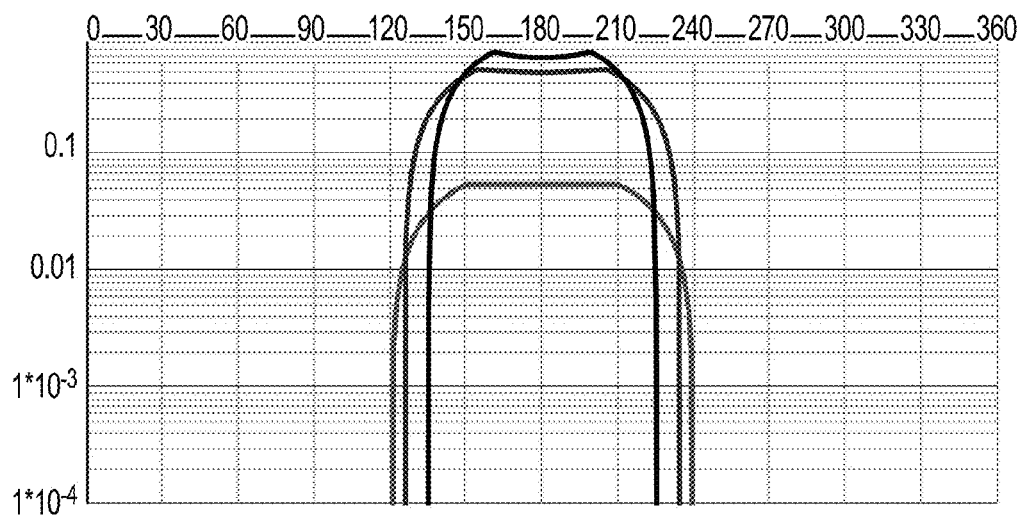
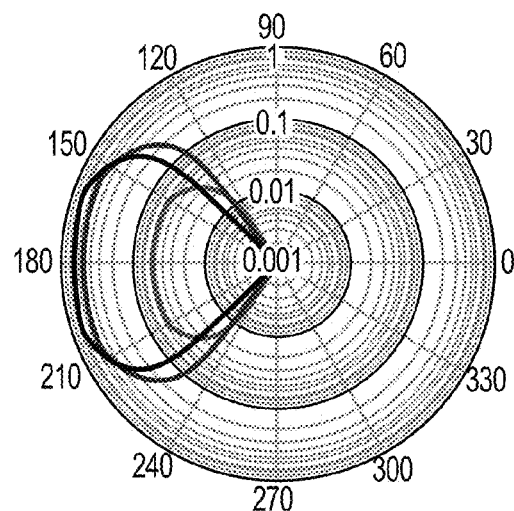
FIG. 26

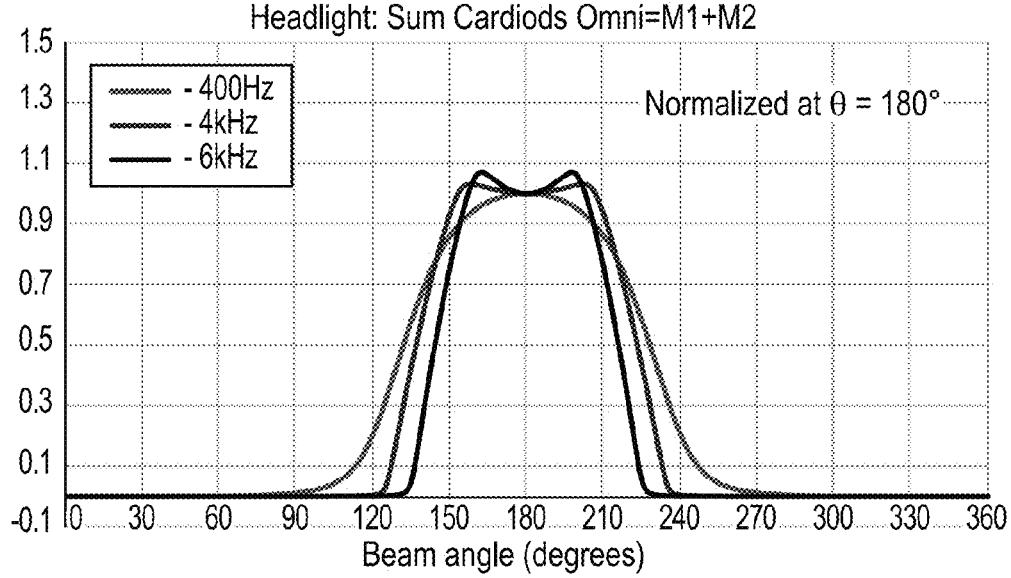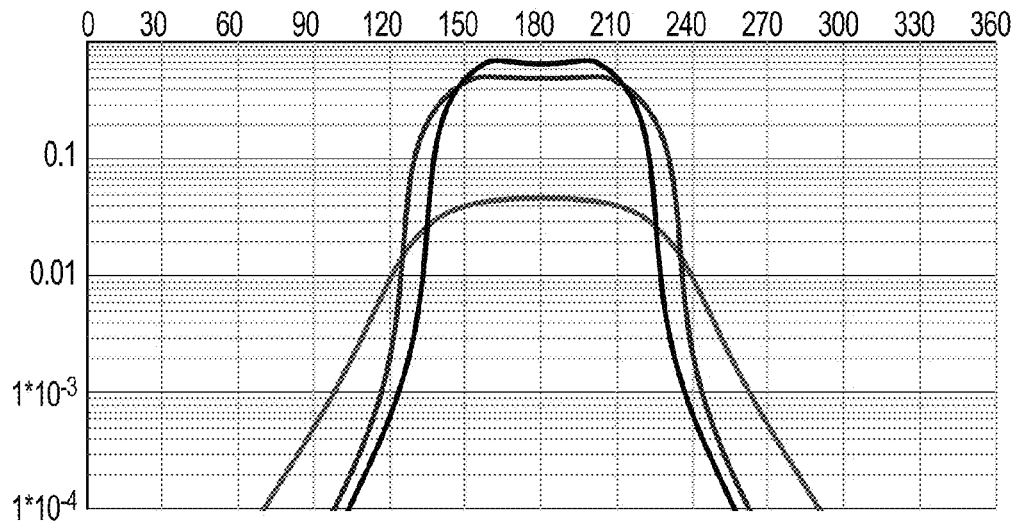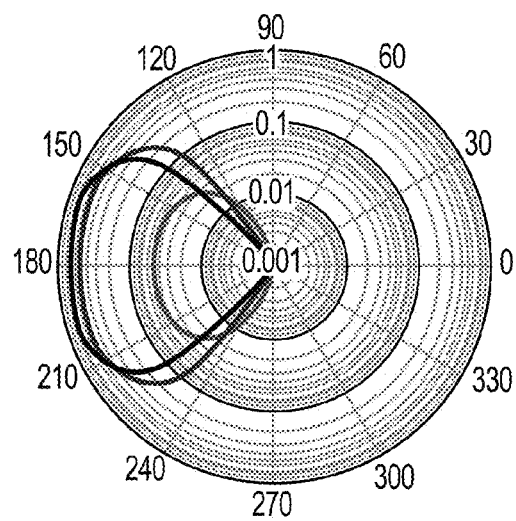
FIG. 28

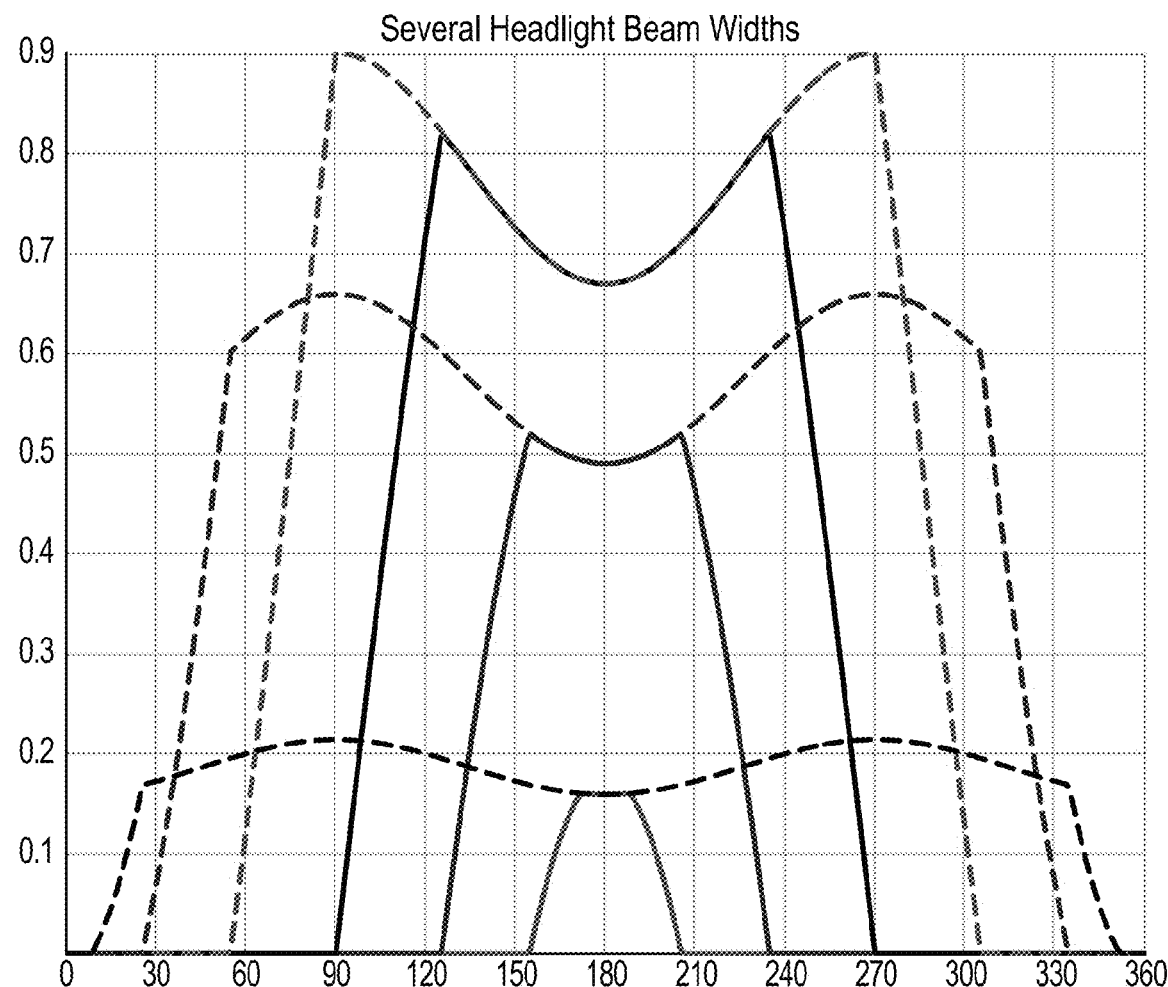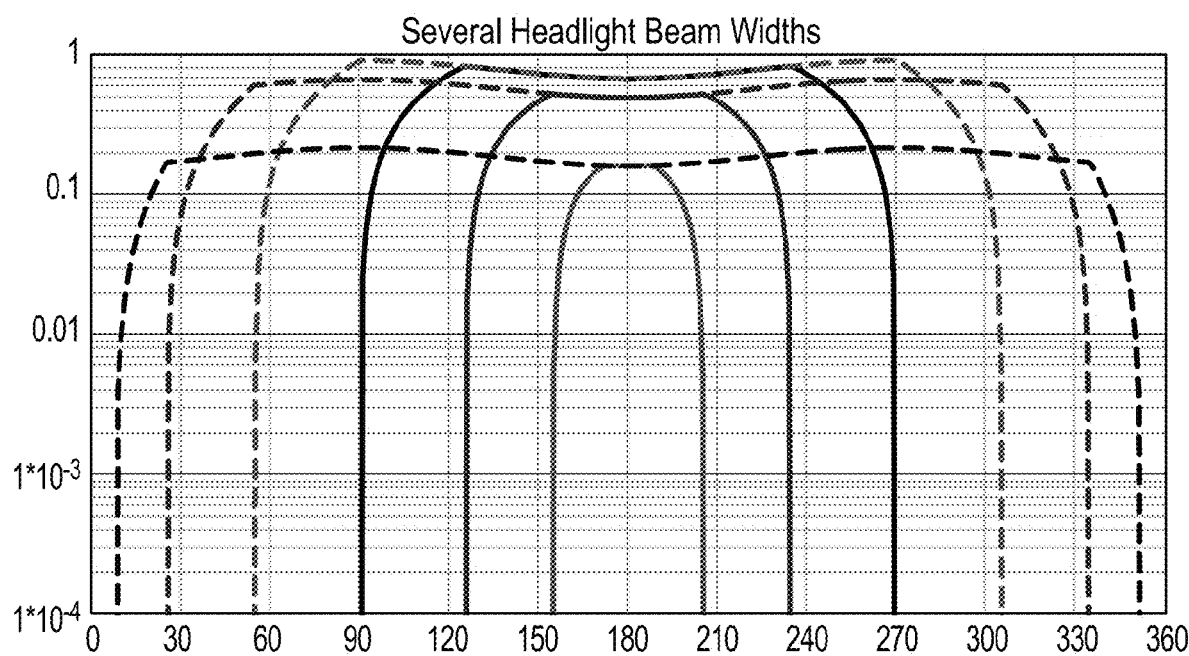
FIG. 30

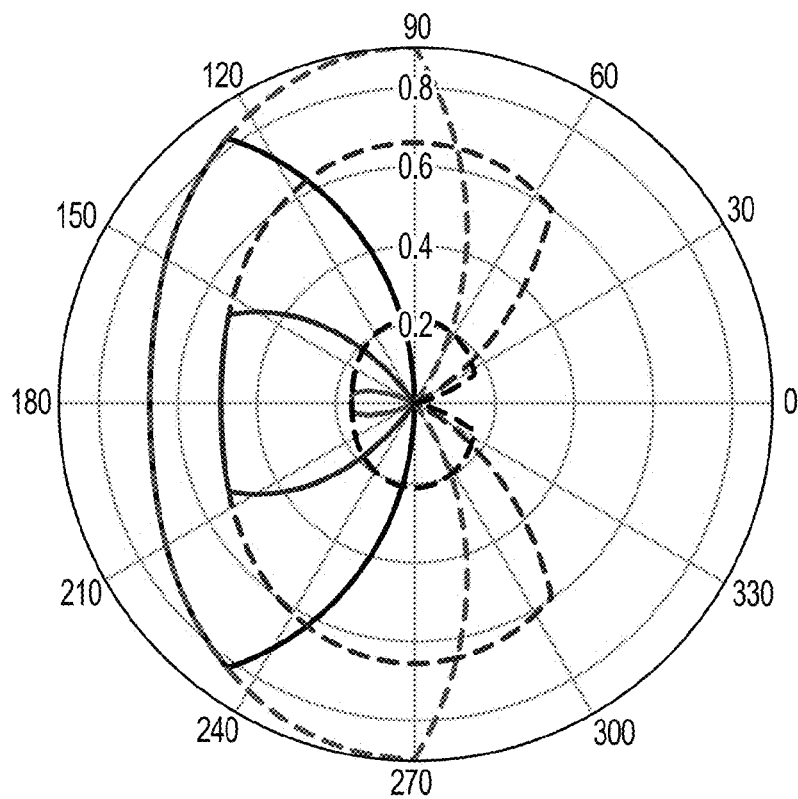
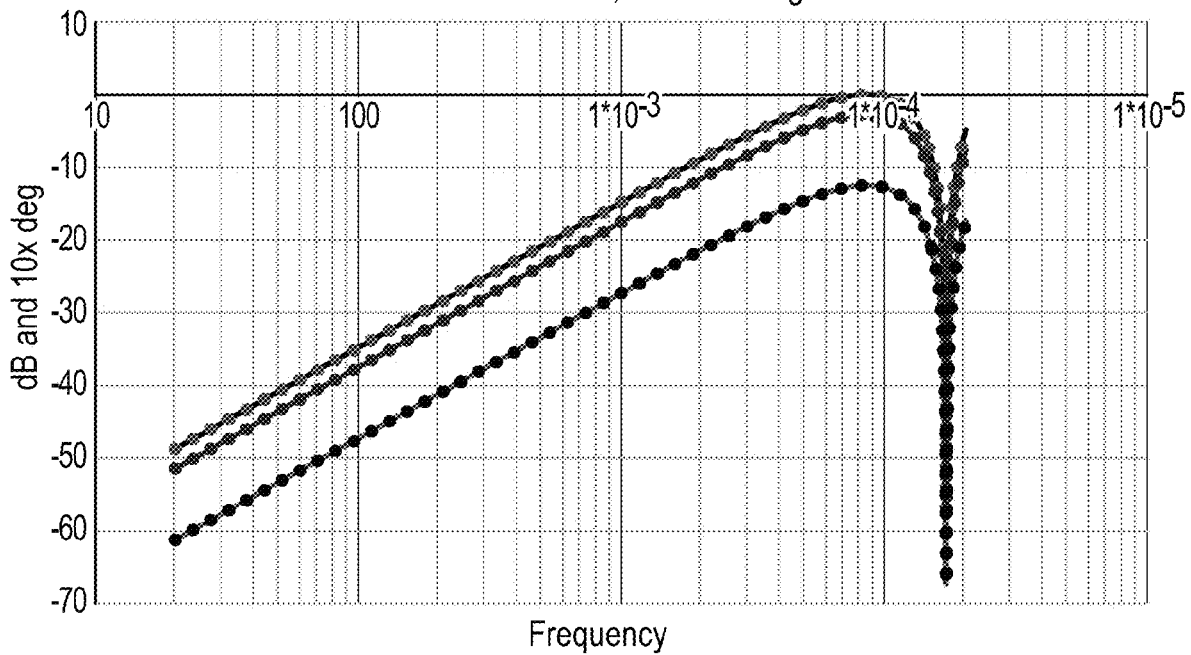
FIG. 31

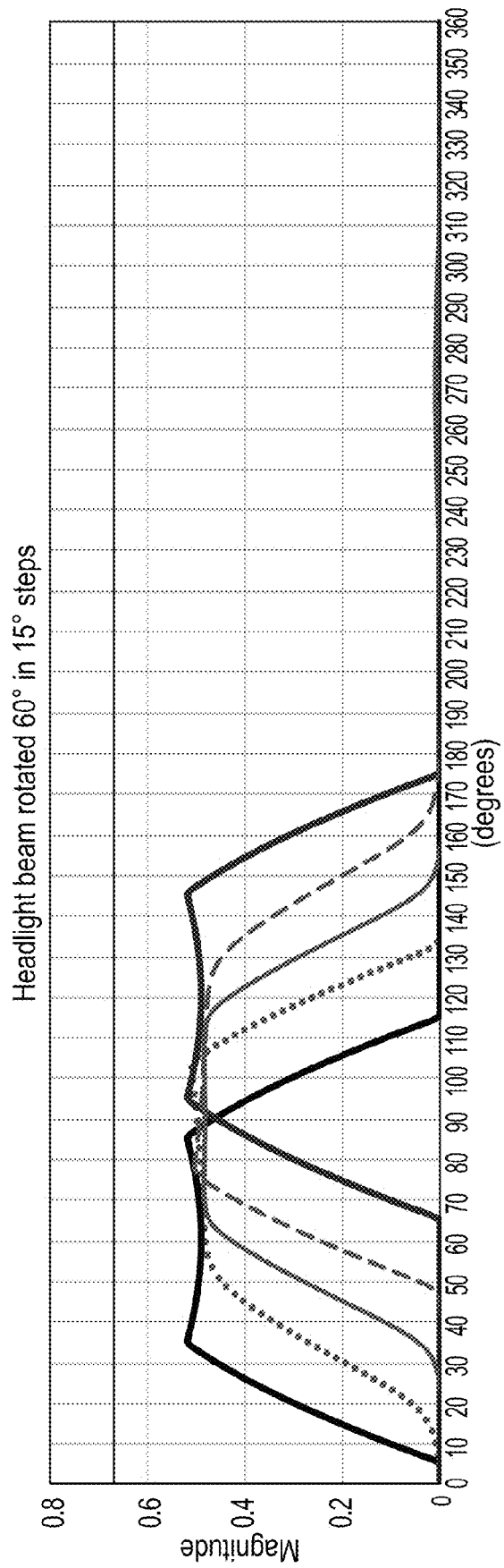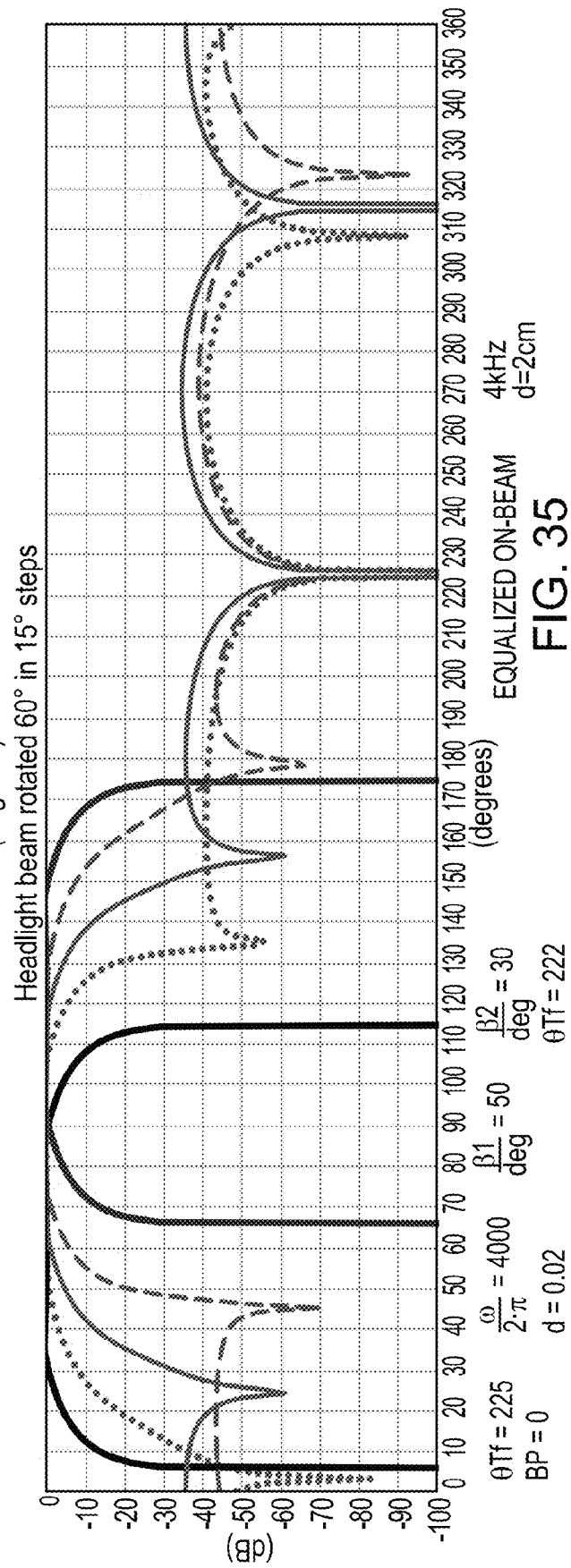
FIG. 35

FLUX BEAMFORMING

RELATED APPLICATION

This application claims the benefit of U.S. Provisional Application No. 63/261,399, filed on Sep. 20, 2021. The entire teachings of the above application are incorporated herein by reference.

BACKGROUND

Conventional beamforming techniques depend on time delays between phased arrays of sensors to form the beam. Common sensors include phased antenna arrays for Radio Frequency beams, phased microphone arrays for sound beams and phased sensor arrays for ultrasound. The fundamental physics of these beams generates undesirable side lobes in the rejection zone and the reception zone has a necessarily curved sensitivity profile. The phased technique also necessarily distorts the phase of the on-beam signals. Reduction of the side lobes in the rejection zone requires a large number of sensors for still relatively poor results. The phasing technique also makes the beam shape strongly frequency dependent, usually degrading with higher frequencies. This is of particular importance in sound applications that cover up to three decades of bandwidth. In the case of relatively low RF frequencies of a few megahertz or less, the required antennas can become impractically large.

SUMMARY

Example embodiments include a method of generating a flux beam. A plurality of flux signals may be detected via a sensor array comprising a plurality of sensors. A plurality of flux patterns may then be generated based on the plurality of flux signals, each of the plurality of flux patterns representing a respective one of the plurality of flux signals. A plurality of flux magnitude patterns may be generated based on the plurality of flux patterns, each of the plurality of flux magnitude patterns representing an absolute value of a respective one of the plurality of flux patterns. A flux beam may then be generated as a function of the plurality of flux magnitude patterns.

The flux pattern may be a result of at least one of an addition and a subtraction of the plurality of flux magnitude patterns. The plurality of flux signals may be one of magnetic fluxes, light fluxes, sound velocity fluxes, radio frequency magnetic flux signals, ultrasound velocity flux signals, infrasound velocity flux signals, fixed flux signals, and variable flux signals. The sensor array may include at least two microphones, the plurality of flux signals being sound velocity fluxes. Sound velocity fluxes may be based on a spatial difference of a sound pressure measured by the at least two microphones. The microphones may be one or more of an omnidirectional microphone, a figure-8 microphone, a cardioid microphone, a hyper-cardioid microphone, and a super-cardioid microphone.

Generating the plurality of flux magnitude patterns may include processing each of the plurality of flux signals via a Fourier transform. Likewise, generating the flux beam includes processing a signal representing the plurality of flux magnitude patterns via an inverse Fourier transform. The plurality of flux signals may be a subset of flux signals detected by the sensor array, the subset of flux signals having a common frequency, which may be zero. The subset may be a first subset, and the method may further comprise generating a subsequent flux pattern as a function of a second subset of flux signals having a common frequency that is distinct from the frequency of the first subset. The flux pattern may be a result of at least one of a linear sum and a linear difference of magnitudes of the subset of flux signals. The flux pattern may be a result of at least one of a sum, a difference, and a multiplication of magnitudes of the subset of flux signals in a frequency domain. The flux pattern may be a result of at least one of a sum, a difference, and a multiplication of magnitudes of the subset of flux signals in an inverse of a frequency domain, the inverse of the frequency domain being at least one of a time domain and a space domain.

The flux beam may be a first flux beam, and the method may further comprise combining a magnitude of the first flux beam with a magnitude of a second flux beam via a multiplication operation to generate a combined flux beam. The combined flux beam may be a function of a square root of the multiplication of the first flux beam and the second flux beam. The first flux pattern may be a unidirectional beam and the second flux pattern may be a bidirectional beam. Alternatively, the first flux pattern may be a bidirectional beam and the second flux pattern may be a bidirectional beam. Further still, the first flux pattern may be a unidirectional beam and the second flux pattern may be a unidirectional beam.

The sensor array may include three sensors positioned at points of a triangle, and the method may further comprise 1) assigning a first sensor of the three sensors as a pivot, and 2) generating a virtual plane-rotated sensor via linear interpolation between a second sensor and a third sensor of the three sensors. Alternatively, the sensor array may include four sensors positioned at points of a tetrahedron, and the method may further comprise 1) assigning a first sensor of the four sensors as a pivot, and 2) generating a virtual sensor with two plane rotations via linear interpolation between second, third and fourth sensors of the fourth sensors.

The sensor array includes a plurality of sensors, and the method may further comprise 1) assigning a first sensor of the plurality of sensors as a pivot, and 2) generating a virtual sensor via linear interpolation between a remainder of the plurality of sensors. A plurality of flux phase patterns may be generated, including the at least one flux phase pattern, based on the plurality of flux signals, each of the plurality of flux phase patterns representing a phase of a respective one of the plurality of flux signals. The flux beam may be generated as a function of at least one flux phase pattern, the at least one flux phase pattern representing a phase of a respective one of the plurality of flux patterns.

The sensor array may include at least one of an electric field sensor, a magnetic loop antenna, a hall effect sensor, and a flux gate sensor. The plurality of flux signals may be magnetic fluxes, and the magnetic fluxes may be based on a spatial difference of two varying electric field signals detected by the sensor array. The method may further comprise 1) detecting an external signal propagated outside of the flux beam, 2) determining a frequency of the external signal, and 3) reducing a magnitude of signals detected within the flux beam that match the frequency.

Further embodiments include an apparatus comprising a sensor array and a signal processor. The sensor array may comprise a plurality of sensors and may be configured to detect a plurality of flux signals. The signal processor may be configured to 1) generate a plurality of flux patterns based on the plurality of flux signals, each of the plurality of flux patterns representing a respective one of the plurality of flux signals; 2) generate a plurality of flux magnitude patterns based on the plurality of flux patterns, each of the plurality of flux magnitude patterns representing an absolute value of a respective one of the plurality of flux patterns; and 3) generate a flux beam as a function of the plurality of flux magnitude patterns.

The flux beam may be a function of at least one flux phase pattern, the at least one flux phase pattern representing a phase of a respective one of the plurality of flux patterns. The signal processor may be further configured to 1) generate a plurality of flux phase patterns based on the plurality of flux signals, each of the plurality of flux phase patterns representing a phase of a respective one of the plurality of flux signals; and 2) generate the flux beam as a function of the plurality of flux phase pattern.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIGS. 4A-C are plots depicting a flux magnitude addition in one embodiment.

FIGS. 5A-C are plots depicting flux beam shaping in one embodiment.

FIGS. 11A-C are plots depicting hemisphere beam forming in one embodiment.

FIGS. 16A-C are plots depicting spear beam forming in one embodiment.

FIGS. 17A-E are plots depicting two-dart beam forming in one embodiment.

FIG. 25 is a set of plots depicting a headlight beam formed with sum type hypercardioid microphones in one embodiment.

FIG. 26 is a set of plots depicting a headlight beam formed with sum type hypercardioid microphones in a further embodiment.

FIGS. 27-29 are plots depicting the effects of microphone mismatches in one embodiment.

FIGS. 30-31 are plots depicting headlight beams generated in an example embodiment.

FIGS. 34-38 are plots depicting rotated headlight beams in one embodiment.

DETAILED DESCRIPTION

A description of example embodiments follows. The teachings of all patents, published applications and references cited herein are incorporated by reference in their entirety.

Figure 1A:
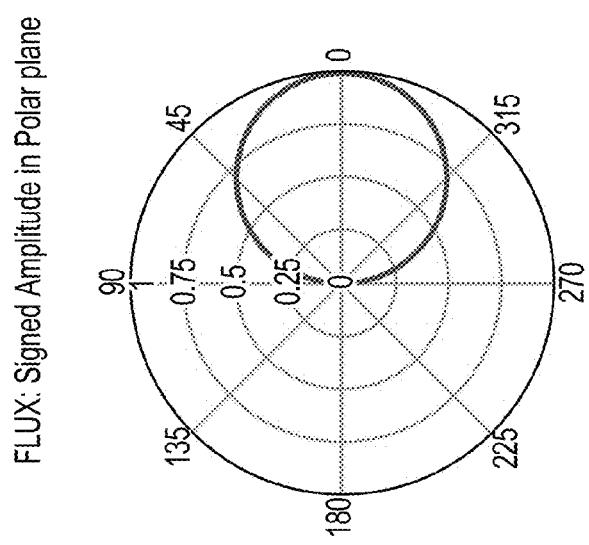
FIGS. 1A-C are plots depicting a single flux signal.
Figure 1B:
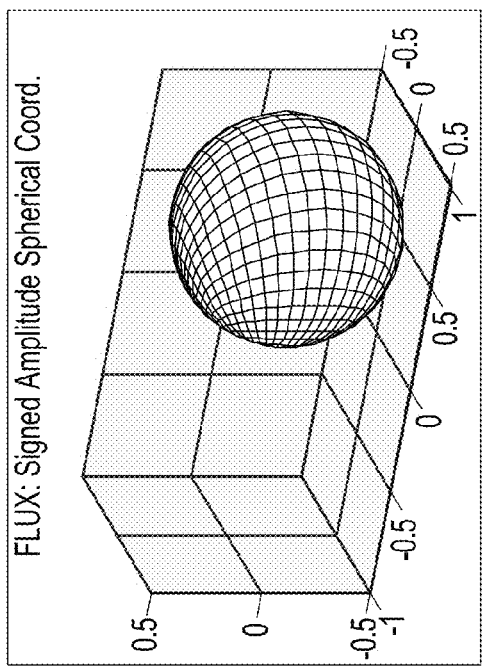
Figure 1C:
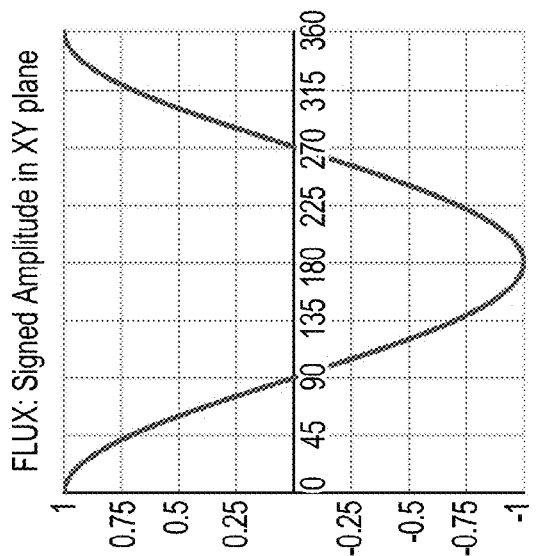

FIGS. 1A-C are plots depicting a single flux signal. Flux is considered here for its properties that are independent of time or phase. A magnetic flux, a light flux or a sound velocity flux are relevant examples. The amount of unidirectional parallel flux through a finite planar surface depends on the intensity and angle of the flux. The pattern for signed amplitude representation of this flux on a horizontal plane slice in polar coordinates is a pair of coincident circles, in spherical coordinates it is a pair of coincident spheres and a horizontal plane slice in Cartesian coordinates has a sine shape. The description below assumes a parallel unidirectional flux through a closed surface.

Figures 2A, 2B, 2C:
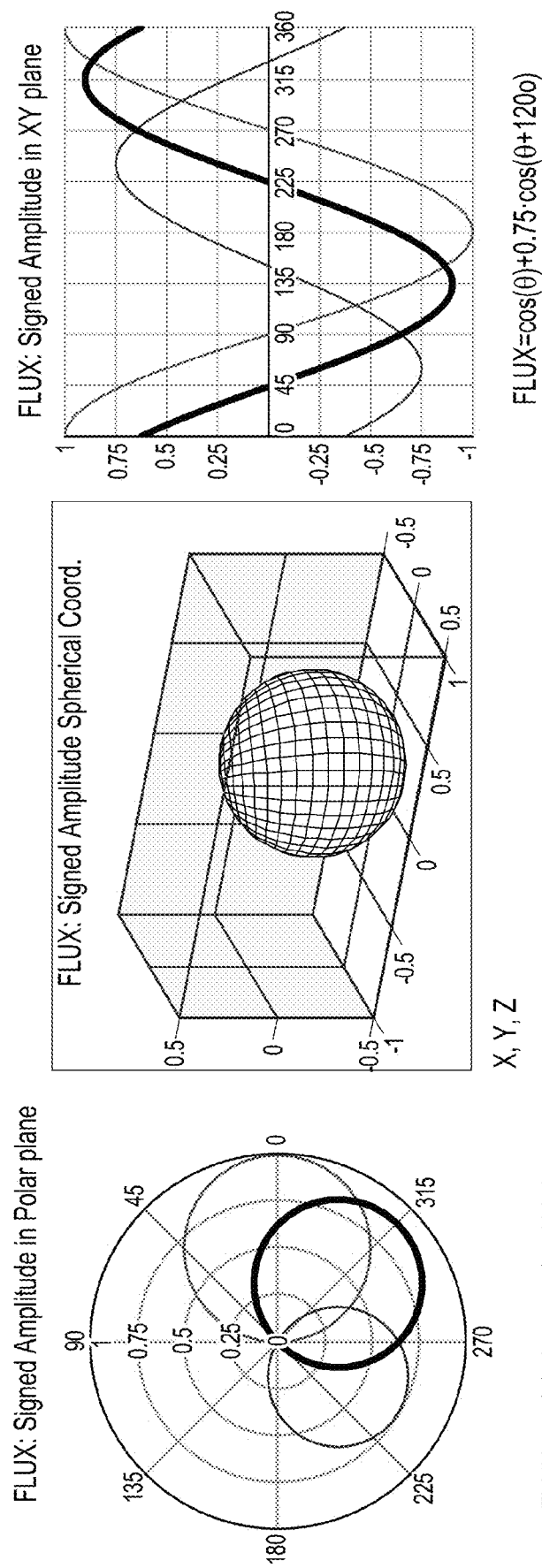
FIGS. 2A-C are plots depicting addition of two flux signals.

FIGS. 2A-C are plots depicting addition of two flux signals. If two different fluxes of the same physical type, are added together, the resulting beam shape will remain identical to that of a single flux, but with a new magnitude and angular orientation. This means that beam forming of a flux cannot be achieved by linearly adding different fluxes. In the example shown, the black pattern is the sum of the red and blue patterns. The spherical representation in the FIG. 2B only shows the resulting sum of the two fluxes. Note that it appears rotated and slightly diminished compared to the representation of FIG. 1B.

Figures 3A, 3B, 3C:
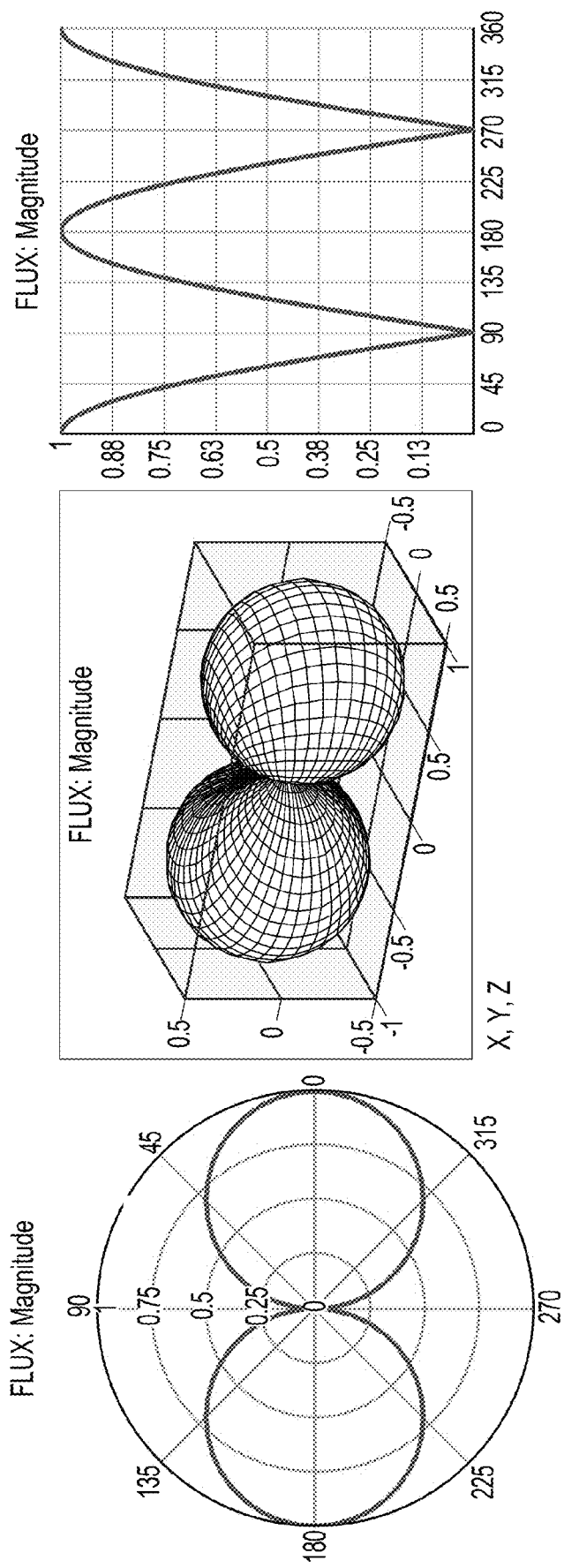
FIGS. 3A-C are plots depicting a flux magnitude.

FIGS. 3A-C are plots depicting a flux magnitude. The absolute value (magnitude) of the flux has a related pattern to the signed magnitude flux, but the magnitude of the sine functions that describe the shape shows patterns with only positive values. The 2D slice now has two sharp notches. The 3D pattern is no longer a pair of coincident spheres, but a pattern of tangential spheres. The notches of the pattern are at the tangential point.

FIGS. 4A-C are plots depicting a flux magnitude addition in one embodiment. If the magnitude patterns are combined with scaled addition or subtraction, new shapes emerge, thus opening the potential for flux beam forming. This example repeats the elemental patterns of the linear signed magnitude sum, but using only their magnitude to illustrate that sharper beam shapes are possible. In this example, the black pattern is the difference between the red magnitude and blue magnitude patterns. The rectified sine shape of a figure-8 pattern is rich in spatial harmonics, so that new shapes can be created by adding or subtracting rectified sine shapes of different spatial amplitudes and phases. Scaled sums of pure sine shapes of flux can't create new shapes because a pure spatial sine has no spatial harmonics.

FIGS. 5A-C are plots depicting flux beam shaping in one embodiment. This first example of useful beam forming adds two equal magnitude figure-8 flux patterns rotated +40° in red and −40° in blue and subtracts a third pattern in magenta that is not rotated and its amplitude is equal to the sum of the other two patterns at 0° or 180°, which is 2*cos(40°). See this clearly in the polar and XY plots. This flux pattern is extremely sharp with two identical lobes. The shape is that of glued pairs of clamshells with two circular peripheries. Each lobe is shaped with spherical sections. Note that there are no other side lobes at all. The directions outside the two lobes have absolute zero amplitude. The third plot in XY coordinates shows the zero response between the main lobes very clearly. The vertical cross-section is a figure-8.

In practice, this flux sensing pattern may be constructed from three independent flux sensors (i.e. magnetic loops, photo cells or velocity microphones). But one can also start with one orthogonal set of sensors and then create any newly oriented figure-8 patterns with simple weighed linear sums or subtractions of the signed signals from the orthogonal set. If only 2D rotation is desired, one orthogonal set of three sensors is enough. For 3D rotation, an orthogonal set of four sensors may be implemented.

Figure 6:
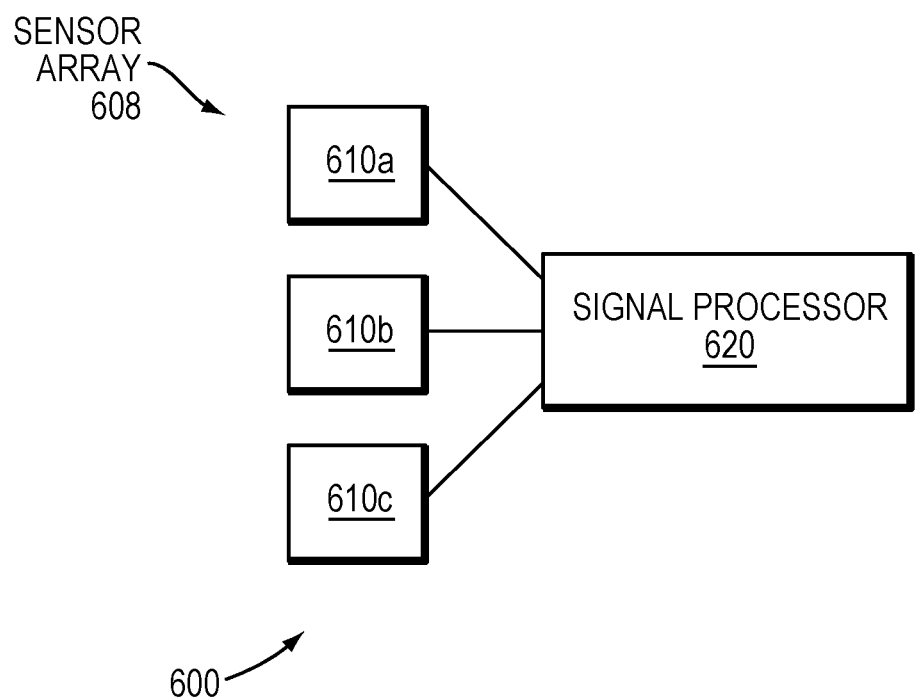
FIG. 6 is a diagram of an apparatus generating a flux beam in one embodiment.

FIG. 6 is a diagram of an apparatus 600 configured to generate a flux beam in one embodiment. The apparatus 600 may include a sensor array 608, comprising a plurality of sensors (e.g., sensors 610a-c, optionally including additional sensors not shown), and a signal processor 620. The sensor array 608 may be configured to detect a plurality of flux signals, such as magnetic fluxes, light fluxes, sound velocity fluxes, radio frequency magnetic flux signals, ultrasound velocity flux signals, infrasound or seismic velocity flux signals, fixed flux signals, and variable flux signals. If detecting sound velocity fluxes, for example, the sensors 610a-c of the array 608 may include at least two microphones, the plurality of flux signals being sound velocity fluxes. Sound velocity fluxes may be based on a spatial difference of a sound pressure measured by the at least two microphones. The microphones may be omnidirectional microphones, figure-8 microphones, cardioid microphones, hyper-cardioid microphones, and/or super-cardioid microphones, for example. Alternatively, if detecting magnetic fluxes, the sensors 610a-c of the array 608 may include one or more electric field sensors and/or magnetic loop antennas, and the magnetic fluxes may be based on a spatial difference of two varying electric field signals detected by the sensor array. The sensors 610a-c of the array 608 may also include one or more hall effect sensors and/or flux gate sensors.

The signal processor 620 may be configured to 1) generate a plurality of flux patterns based on the plurality of flux signals, each of the plurality of flux patterns representing a respective one of the plurality of flux signals; 2) generate a plurality of flux magnitude patterns based on the plurality of flux patterns, each of the plurality of flux magnitude patterns representing an absolute value of a respective one of the plurality of flux patterns; and 3) generate a flux beam as a function of the plurality of flux magnitude patterns. To perform the above operations, the signal processor 620 may incorporate one or more circuits as described herein, such as the circuits described below with reference to FIGS. 7, 10, and 21.

The flux beam generated by the signal processor 620 may be a function of at least one flux phase pattern, which may represent a phase of a respective one of the plurality of flux patterns. The signal processor 620 may be further configured to 1) generate a plurality of flux phase patterns based on the plurality of flux signals, each of the plurality of flux phase patterns representing a phase of a respective one of the plurality of flux signals; and 2) generate the flux beam as a function of the plurality of flux phase pattern.

For the plurality of sensors 610a-c, a first sensor 610a may be assigned as a pivot as described further below, and the signal processor 620 may generate a virtual sensor via linear interpolation between a remainder of the plurality of sensors. The signal processor may generate a plurality of flux phase patterns, including the at least one flux phase pattern, based on the plurality of flux signals, each representing a phase of a respective one of the plurality of flux signals. The flux beam may be generated as a function of at least one flux phase pattern, the at least one flux phase pattern representing a phase of a respective one of the plurality of flux patterns.

The sensor array 608 may include three sensors 610a-c positioned at points of a triangle, and the signal processor 620 may assign a first sensor 610a as a pivot, and then generate a virtual plane-rotated sensor via linear interpolation between the second sensor 610b and the third sensor 610c. Alternatively, the sensor array 608 may include four sensors positioned at points of a tetrahedron, and the signal processor may assign a first sensor 610a as a pivot, and then generate a virtual sensor with two plane rotations via linear interpolation between the remaining sensors.

Figure 7:
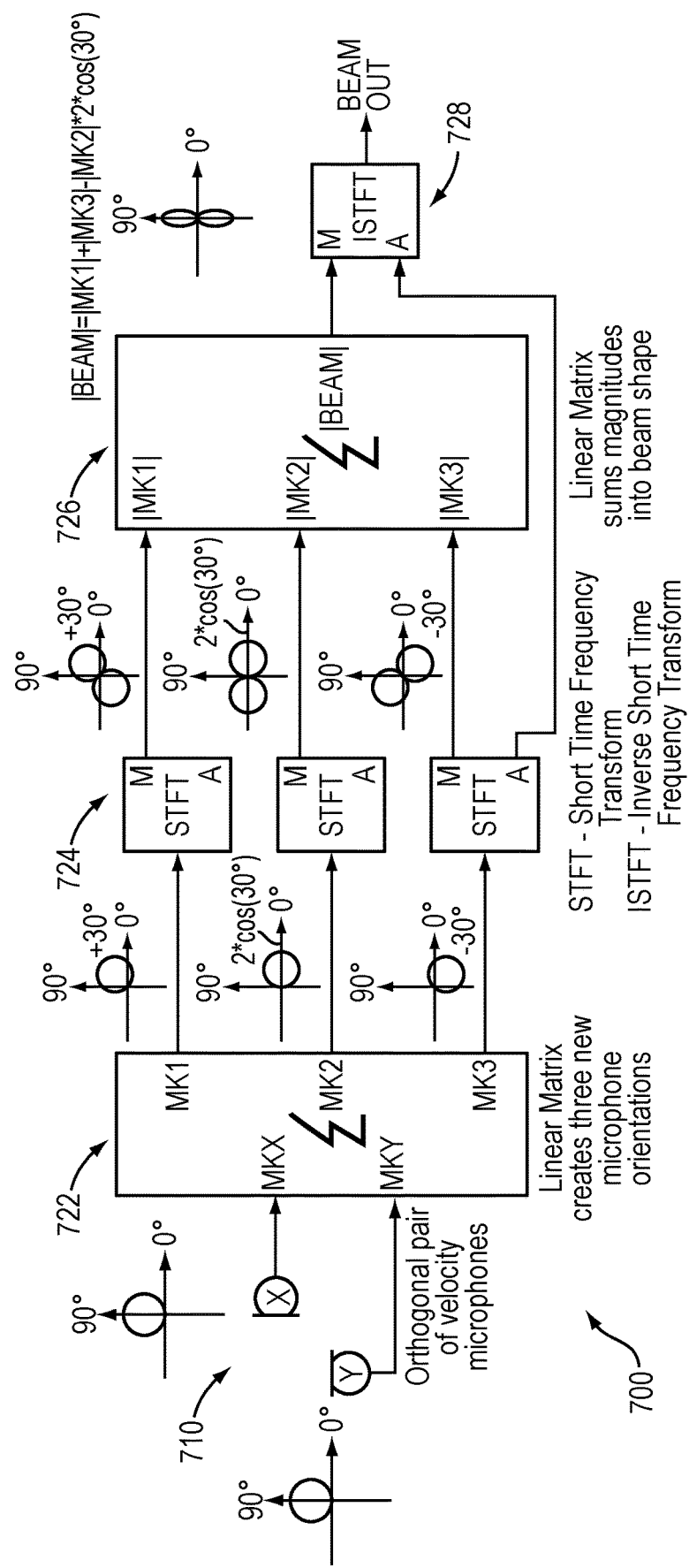
FIG. 7 is a diagram of a circuit providing beam shaping in one embodiment.

FIG. 7 is a diagram of a circuit 700 providing beam shaping in one embodiment, which may be implemented in the signal processor 620 described above with reference to FIG. 6. This illustrative example represents the steady state velocity flux patterns of 3 collocated ribbon microphones 710. The circuit 700 first synthesizes three virtual microphones from scaled sums of the input orthogonal pair of velocity flux microphones via a first linear matrix 722. The first linear matrix 722 can be used to obtain any rotation in the virtual microphones and thus any rotation in the final beam. The flux magnitude beam forming may be done in the frequency domain, wherein a set of short time frequency transform (STFT) blocks receive the output from the first linear matrix 722 and provide respective flux magnitude patterns to a second linear matrix 726. The amplitude term of each frequency bin may be used in the flux beam forming calculations and the phase may be bypassed from one or a combination of the input sensors to the output. From the point of view of flux magnitude beam forming, there may be negligible phase difference between the collocated ribbon microphones. Bins that only capture audio from the rejection zone of the beam will have zero amplitude but with the original phase. In the special case of a fixed DC flux field, which would be bin 0 in a frequency record, the sign of the input field is passed to the output to multiply with the output magnitude to reestablish the polarity of the flux. The second linear matrix 726 sums the flux magnitude patterns into beam shapes, which are received by an inverse short time frequency transform (ISTFT) block 728 to generate a resulting flux beam.

While manipulating the amplitude of a frequency bin independently of its phase is a nonlinear operation, no new harmonics are created. If content from two directions is in one frequency bin, and if the dominant source is off-beam, the beam is silenced, if the dominant direction is on-beam, then the on-beam magnitude is attenuated by the off-beam signals. The block diagram shows the simplest implementation for the phase A taken from the virtual microphone MK3. A lower noise solution with less phase interference from off-beam signals would use one more STFT blocks 724 to transform signal from the 90° direction to produce the phase for the output.

Figure 8:
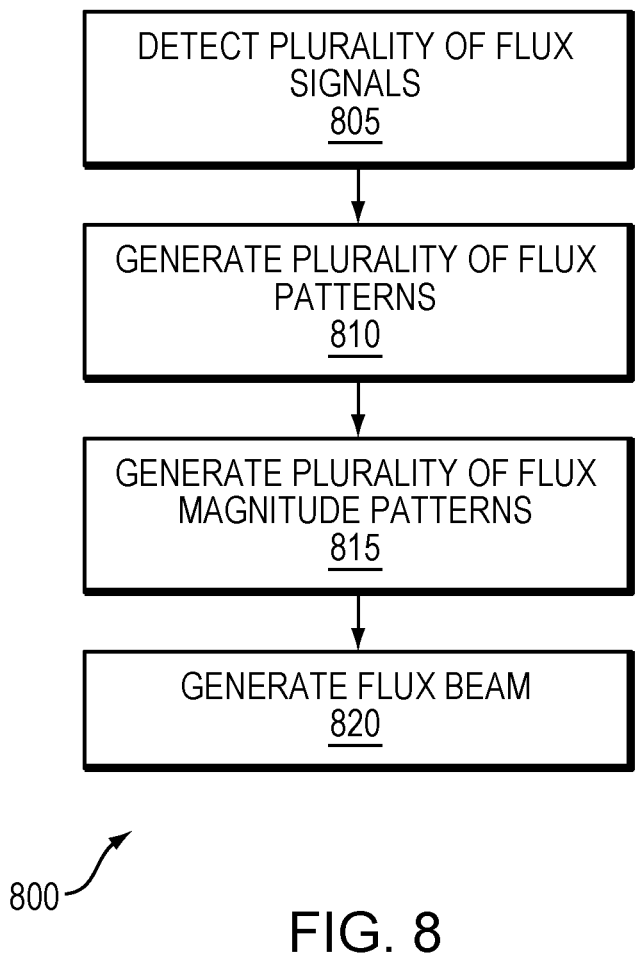
FIG. 8 is a flow diagram of a process of generating a flux beam in one embodiment.

FIG. 8 is a flow diagram of a process 800 of generating a flux beam in one embodiment. The process 800 may be implemented by the apparatus 600 described above, optionally with one or more of the circuits also described herein. With reference to FIG. 6, a plurality of flux signals may be detected via a sensor array 608 comprising a plurality of sensors 610*a-c* (805). The plurality of flux signals may be a subset of flux signals detected by the sensor array 608, and the subset of flux signals may have a common frequency (e.g., zero). The subset may be a first subset, and the process 800 may further comprise generating a subsequent flux pattern as a function of a second subset of flux signals having a common frequency that is distinct from the frequency of the first subset.

Via the signal processor 620, for example, a plurality of flux patterns may then be generated based on the plurality of flux signals, each of the plurality of flux patterns representing a respective one of the plurality of flux signals (810). The flux pattern may be a result of one or more processing operations as described herein. For example, the flux pattern may be a result of 1) a linear sum and a linear difference of magnitudes of the subset of flux signals, 2) a sum, a difference, and/or a multiplication of magnitudes of the subset of flux signals in a frequency domain, and/or 3) a sum, a difference, and/or a multiplication of magnitudes of the subset of flux signals in an inverse of a frequency domain, the inverse of the frequency domain being a time domain and/or a space domain.

A plurality of flux magnitude patterns may be generated based on the plurality of flux patterns, each of the plurality of flux magnitude patterns representing an absolute value of a respective one of the plurality of flux patterns (815). For example, generating the flux magnitude patterns may include processing each of the plurality of flux signals via a Fourier transform. A flux beam may then be generated as a function of the plurality of flux magnitude patterns (820). For example, the flux pattern may be a result of at least one of an addition and a subtraction of the plurality of flux magnitude patterns and may include processing a signal representing the plurality of flux magnitude patterns via an inverse Fourier transform.

The flux beam may be a first flux beam, and the process 800 may further comprise combining a magnitude of the first flux beam with a magnitude of a second flux beam via a multiplication operation to generate a combined flux beam. The combined flux beam may be a function of a square root of the multiplication of the first flux beam and the second flux beam. The first flux pattern may be a unidirectional beam and the second flux pattern may be a bidirectional beam. Alternatively, the first flux pattern may be a bidirectional beam and the second flux pattern may be a bidirectional beam. Further still, the first flux pattern may be a unidirectional beam and the second flux pattern may be a unidirectional beam. The process 800 may further comprise 1) detecting an external signal propagated outside of the flux beam, 2) determining a frequency of the external signal, and 3) via flux beam formation, reducing a magnitude of signals detected within the flux beam that match the frequency.

Figure 9C:
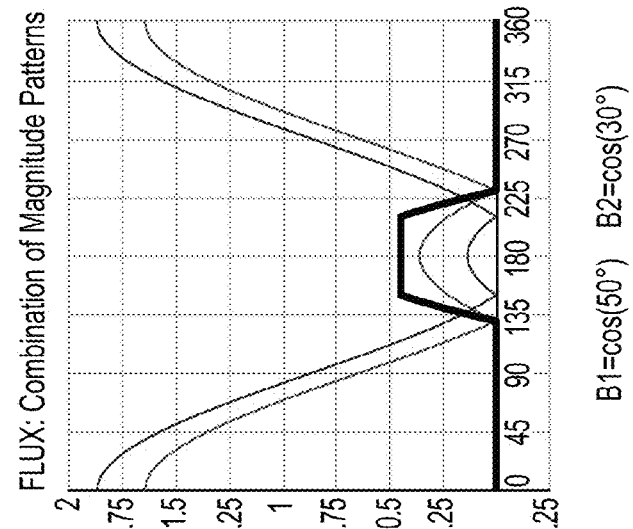
FIGS. 9A-C are plots depicting unidirectional beam forming in one embodiment.
Figure 9B:
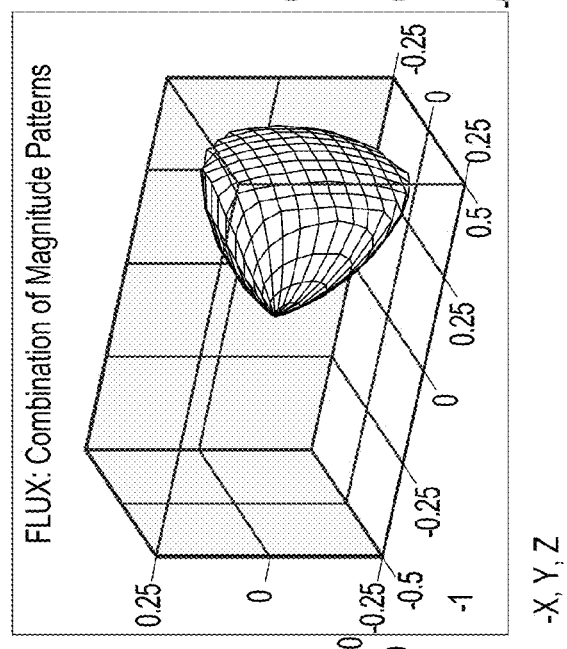
Figure 9A:
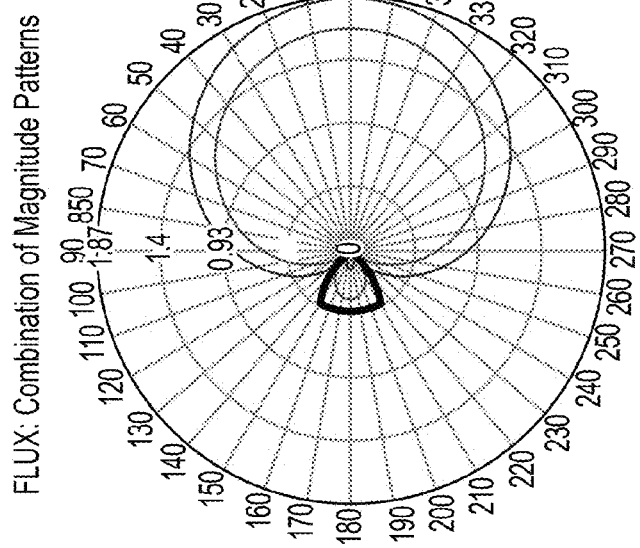

FIGS. 9A-C are plots depicting unidirectional beam forming in one embodiment. Flux magnitude beam forming is fundamentally limited to bidirectional beams. This constraint can be broken by bringing in an omnidirectional component of the field being sensed. In the 1930's the addition of the sound pressure of an omnidirectional microphone to the velocity flux signal of a figure-8 ribbon microphone created the cardioid family of microphones. Then, like now in this presentation, the beam forming was not based on the time dependent properties of the sound field. The microphones were collocated as closely as possible. However, the cardioid family of patterns has very limited set of shapes, always with two opposing complementary sized lobes, where one lobe can be zero.

This example of flux magnitude beam forming subtracts the magnitude of two elemental hypercardioid patterns to create a unidirectional beam that is headlight shaped. The elemental hypercardioids have their notches at +/−30° and +/−50° with respect to 180°. The 3D figure in the second plot was reflected in the X-axis to see the spherical omnidirectional front of the beam with its fixed on-beam sensitivity. The front of the 3D beam shape is a section of sphere with its center at the origin. The front of the beam is a short flat line in the XY plot.

Figure 10:
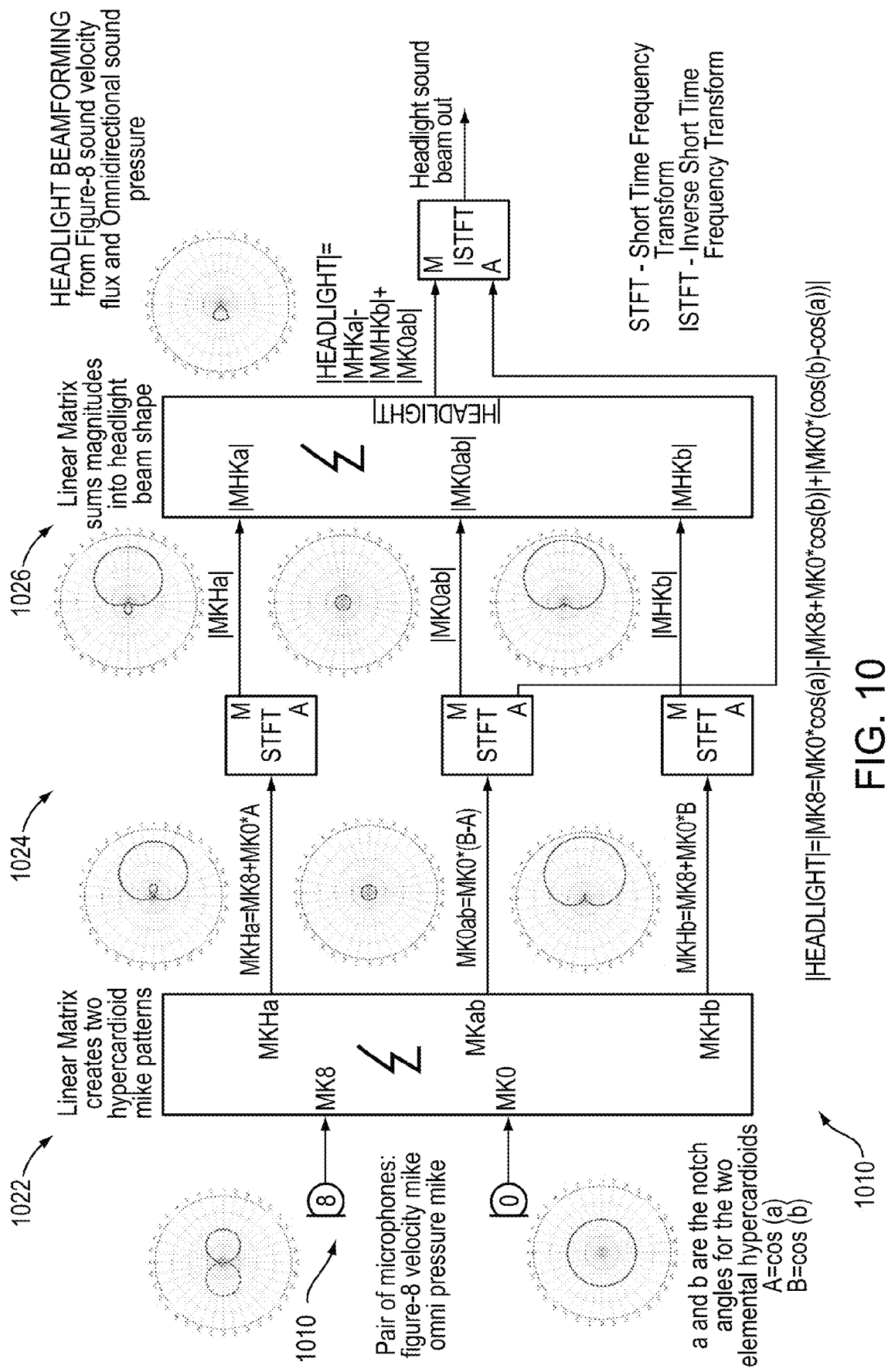
FIG. 10 is a diagram of a circuit providing headlight beamforming in one embodiment.

FIG. 10 is a diagram of a circuit 1000 providing headlight beamforming in one embodiment. Although the example circuit employs microphones to detect sound flux signals, alternative embodiments may employ other sensors as described herein to detect other flux signals. The circuit 1000 may be configured comparably to the circuit 700 described above. In particular, a first linear matrix 1022 may receive a signal input from a pair of microphones, such as a figure-8 velocity microphone and an omni pressure microphone 1010, and may create two hypercardioid microphone patterns. A set of STFT blocks 1024 may generate respective flux magnitude patterns, which are implemented by a second linear matrix 1026 to sum the magnitudes into a headlight beam shape. Lastly, an ISTFT block 1028 may output the resulting flux beam.

FIGS. 11A-C are plots depicting hemisphere beam forming in one embodiment. With a different selection of elemental hypercardioids, the result is a beam that is omnidirectional on one side and has zero response on the other. This shape was created by changing the notch angles to +/−100° and +/−80°. This creates a single omnidirectional lobe that is 160° wide and a rejection zone that is also 160° wide and with 20° wide transition zones. The ability to set the beam width arbitrarily with steep walls suggests that a binary search can be used for detection of the direction of signal source with a sequence of ever narrower beams rotated in a binary sequence of angles.

Figures 12A, 12B, 12C:
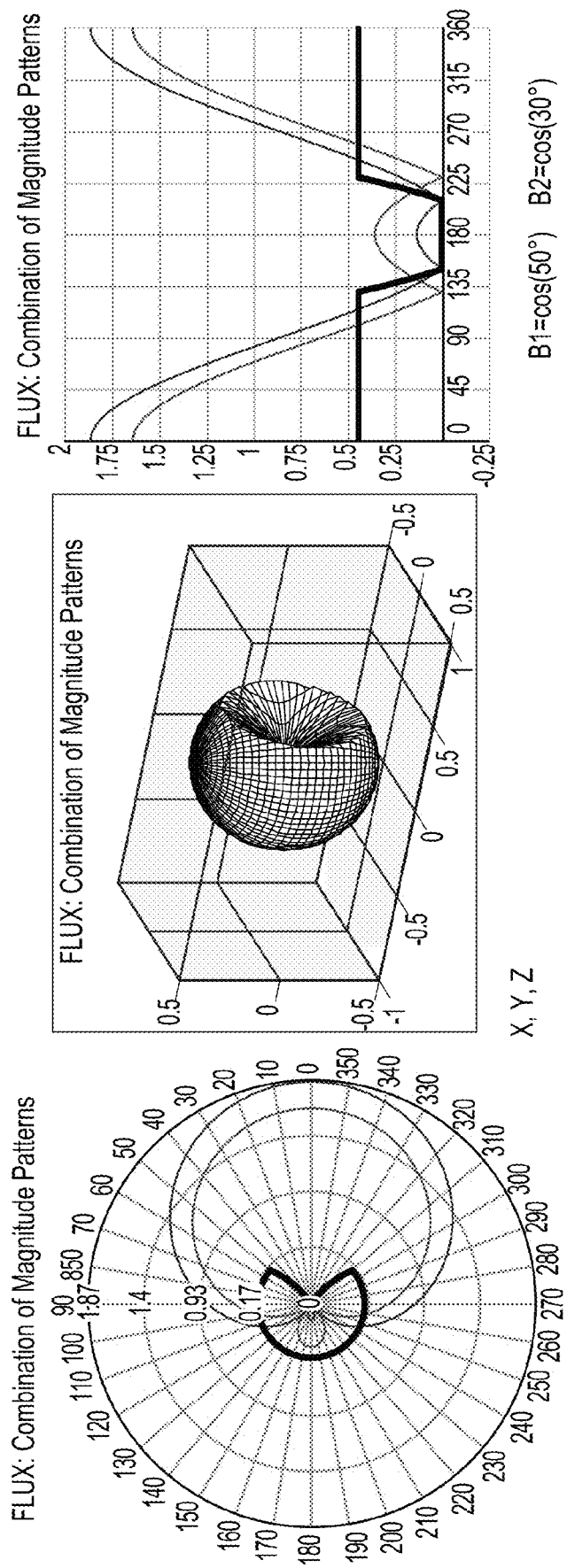
FIGS. 12A-C are plots depicting wide notch beam forming in one embodiment.

FIGS. 12A-C are plots depicting wide notch beam forming in one embodiment. This example is the complement of the first headlight beam. It is obtained by swapping the two B1 and B2 omnidirectional microphone signal quantities in the computation. This beam shows a perfect 60° wide notch with two 20° steep walls and omnidirectional response elsewhere over 260°.

Figures 13A, 13B, 13C:
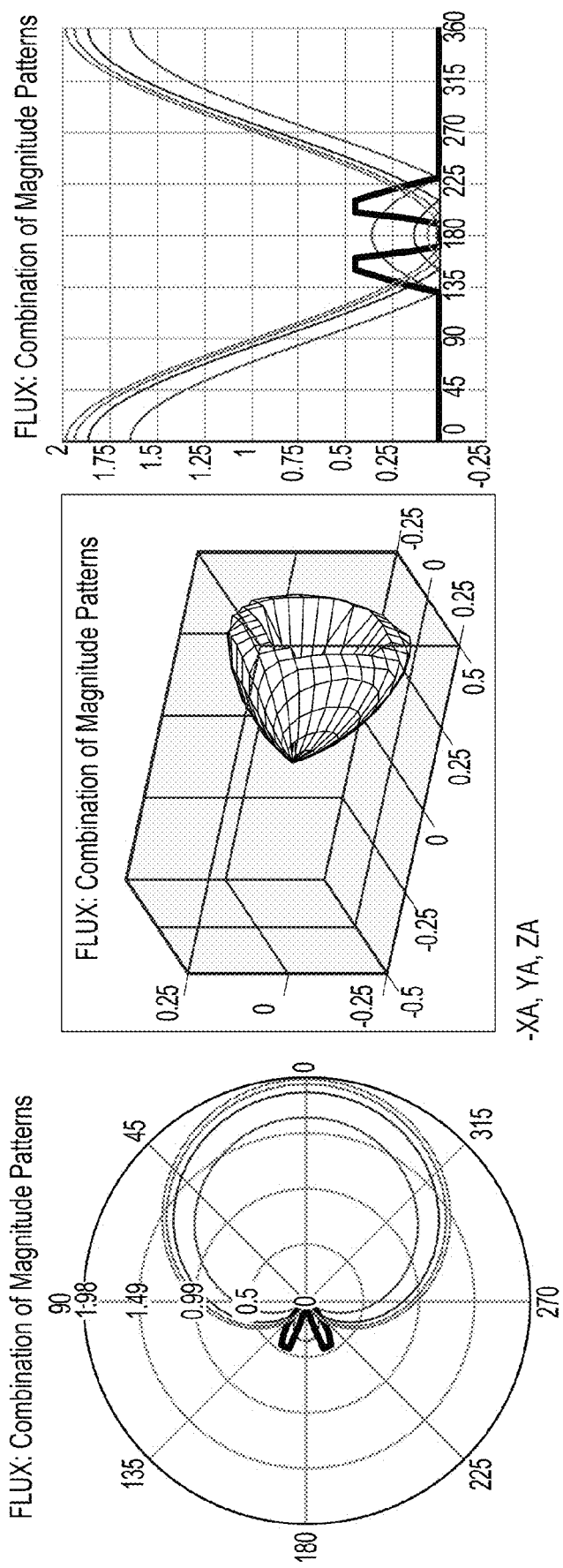
FIGS. 13A-C are plots depicting annular beam forming in one embodiment.

FIGS. 13A-C are plots depicting annular beam forming in one embodiment. This beam subtracts two headlight beams of different widths to create an annular beam with zero response inside and outside the ring. Note how the on-beam response in the annular ring does not change sensitivity within the ring. The annular beam could also be useful in arrays of 2 microphones that are mounted on a surface, where a sound slice is desired and there is no interference from above or below. This is one way to do broad fire as opposed to end fire.

Figures 14A, 14B, 14C:
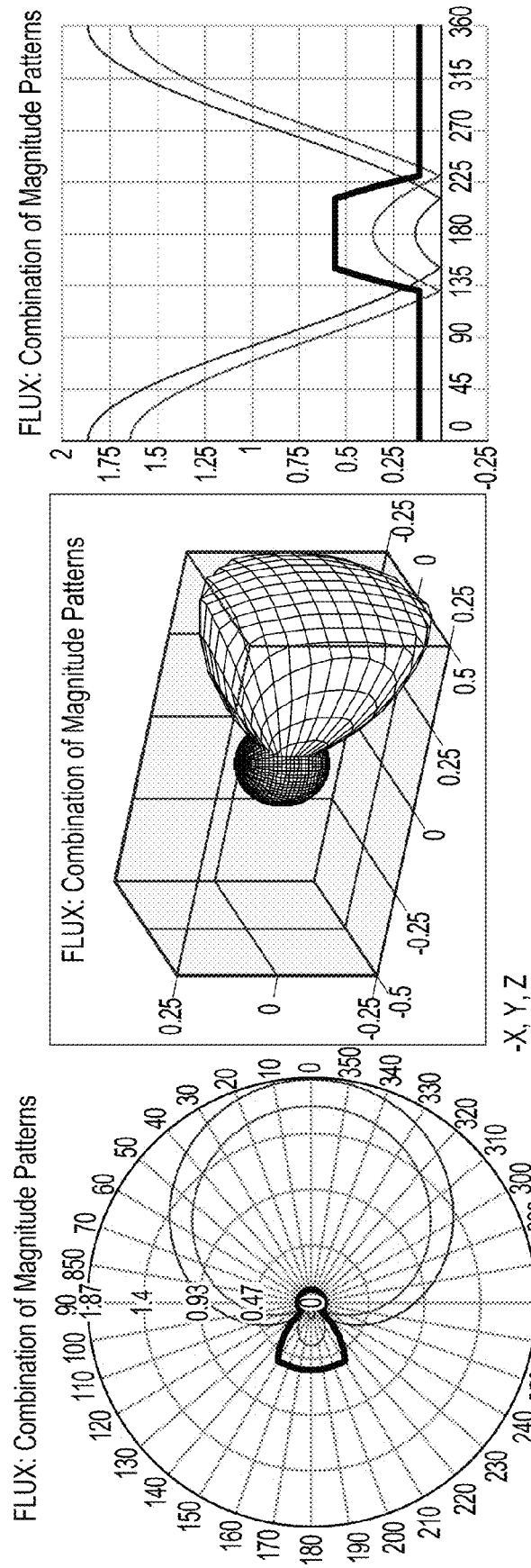
FIGS. 14A-C are plots depicting headlight beam forming in one embodiment.

FIGS. 14A-C are plots depicting headlight beam forming in one embodiment. This example adds −12 dB below the beam of omni to the first headlight beam example. It is obtained by scaling the two B1 and B2 omnidirectional microphone signal scale factors in the computation. This beam shows two levels of omni reception, one inside the beam and one outside the beam.

Figures 15A, 15B, 15C:
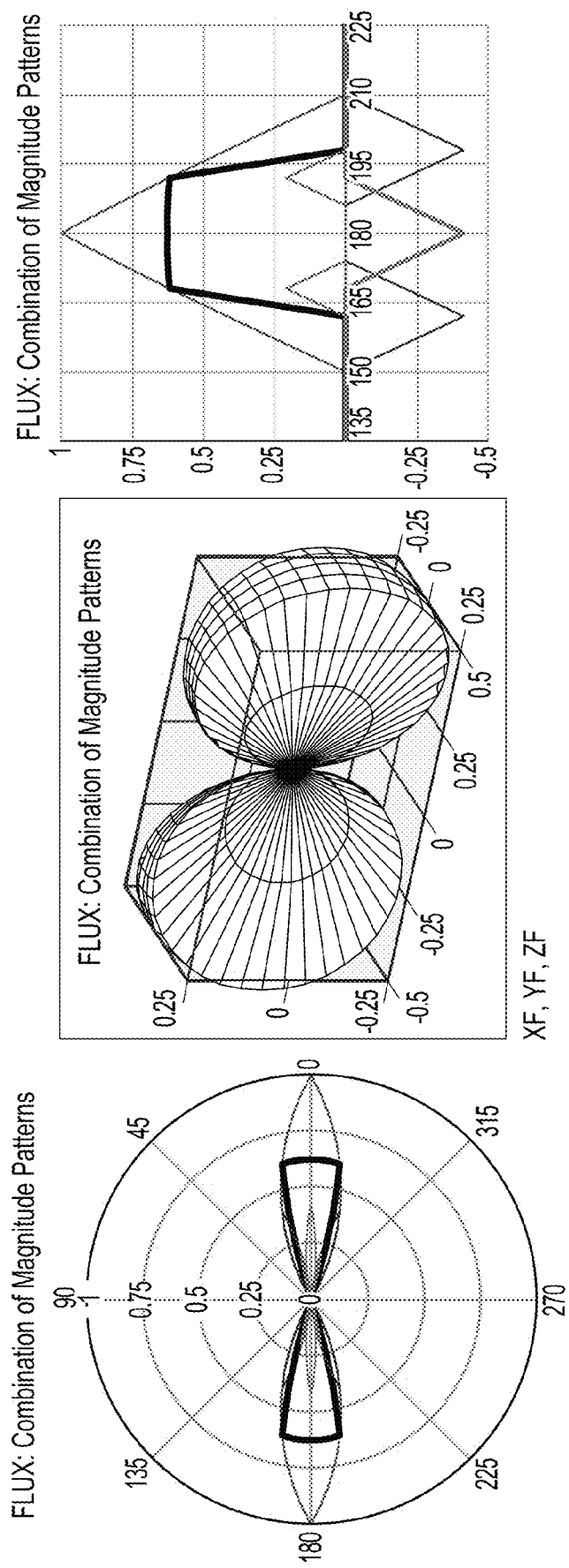
FIGS. 15A-C are plots depicting fan beam forming in one embodiment.
Figure 18A:
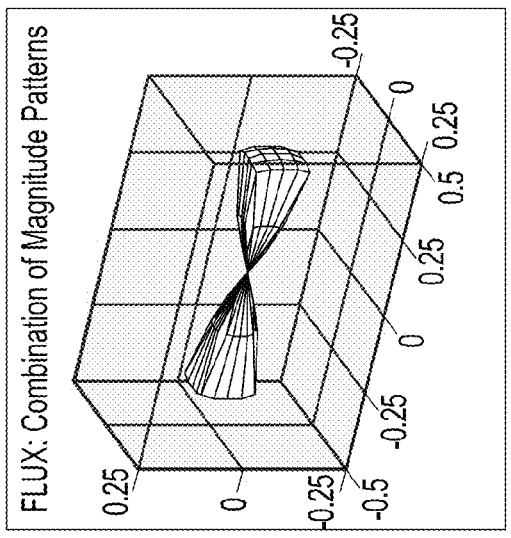
FIGS. 18A-E are plots depicting two-tile beam forming in one embodiment.
Figure 18B:
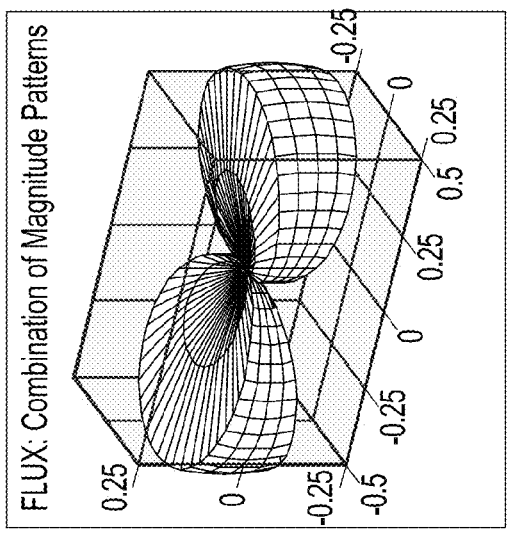
Figure 18C:
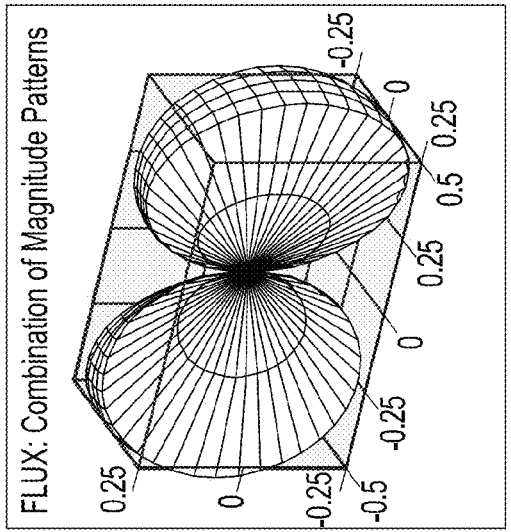
Figure 18D:
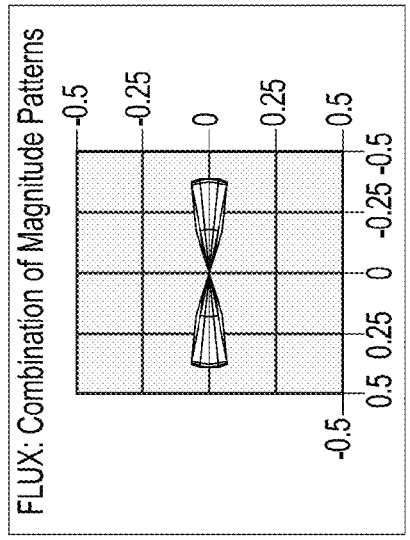
Figure 18E:
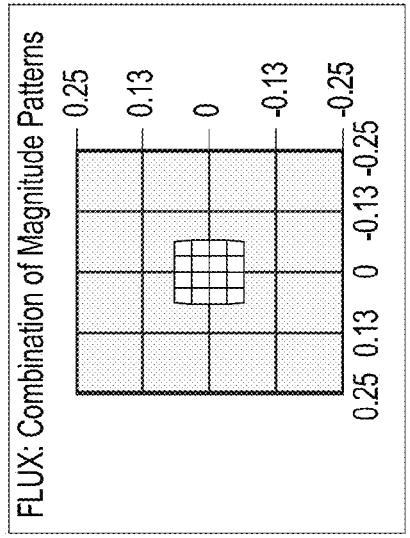

FIGS. 15A-C are plots depicting fan beam forming in one embodiment. This fan-shaped beam is made only with figure-8 flux signals, so it must be bidirectional. It uses 6 elemental clamshell beams with various amplitudes in various degrees of rotation about the Z-axis. The vertical cross-section pattern is a figure-8, which is the same as for the simple clamshell described above with reference to FIGS. 5A-C. The XY plot is horizontally zoomed around the lobe at 180° to show the elemental clamshell beam magnitudes and a nominal beam width of 30° with very sharp walls.

FIGS. 16A-C are plots depicting spear beam forming in one embodiment. This double-spear shaped bidirectional beam is made with a collection of 3 clamshell beams in various orientations. While it may not be optimal, it shows that a very sharp beam can be fashioned for direction finding applications.

FIGS. 17A-E are plots depicting two-dart beam forming in one embodiment. Two bidirectional beams can also be combined with multiplication to obtain beams with a small cross-section that is common to both beams. The figures show the multiplication of two clamshell beams where one of them is rotated 90° about the beam peak. The result is a two-dart beam where the beam peaks are two sharp points. A square root may be applied after the multiplication to reestablish signal linearity, but for ranging and locating applications this is not necessary.

FIGS. 18A-E are plots depicting two-tile beam forming. Here, the multiplication of two fan beams is shown, wherein one of them is rotated 90° about the beam peak. The result is a two-tile beam where the beam peaks are two square tiles.

Figures 19A, 19B, 19C:
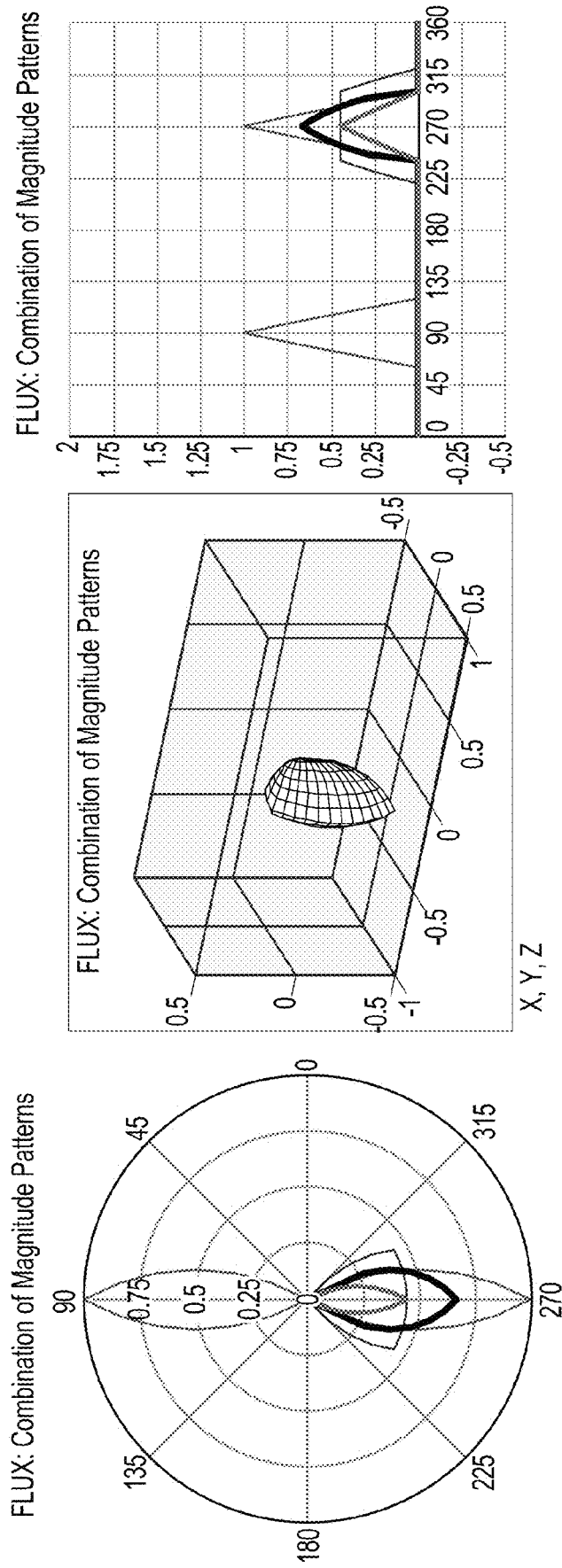
FIGS. 19A-C are plots depicting half shell beam forming in one embodiment.
Figure 20A:
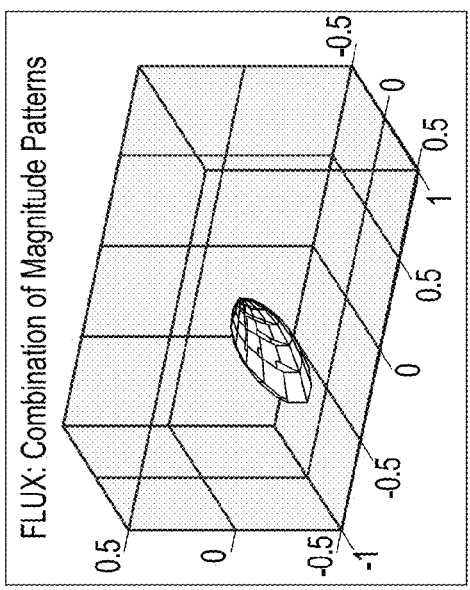
FIGS. 20A-D are plots depicting combined beam forming in one embodiment.
Figure 20B:
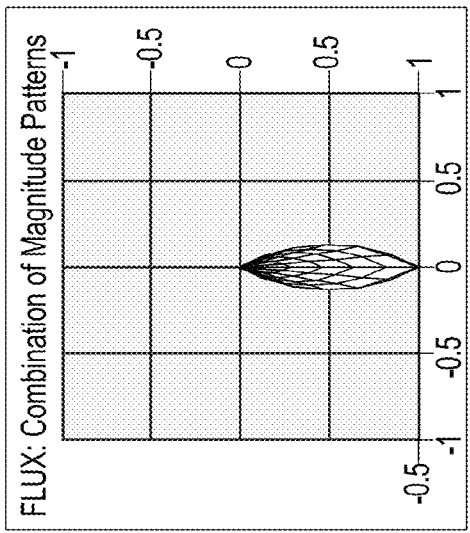
Figure 20C:
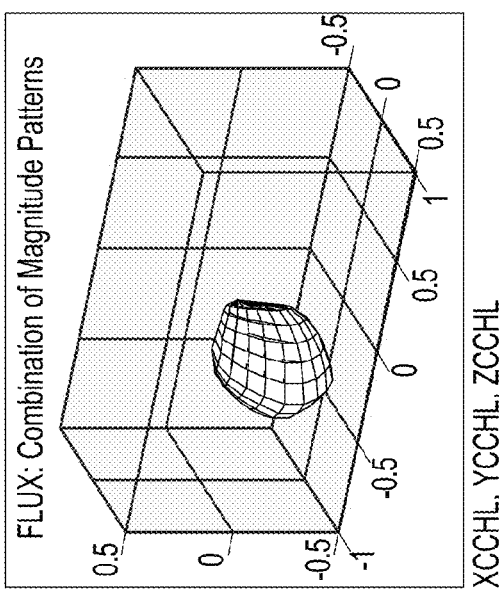
Figure 20D:
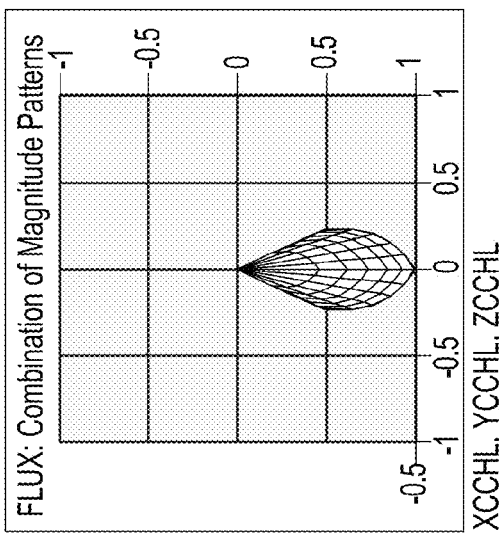

FIGS. 19A-C are plots depicting half shell beam forming in one embodiment. A bidirectional beam can be combined with a unidirectional beam to get some of the properties of both. The resulting beam is unidirectional, but has the high gain sharp peak that is possible with a bidirectional beam. The two beams are combined with a simple multiplication. An optional square root can be applied to restore linearity if desired. The 2D plots show the elemental clamshell beam in red, the elemental headlight beam in blue and the resulting sharp unidirectional beam in magenta without the square root factor and in black with the square root factor to restore signal linearity. The beam shown in 3D has restored linearity with the square root factor. This class of beam is particularly useful for direction finding and ranging applications. The version without the square root factor is particularly sharp for direction finding applications. Note in the 3D figure how the top and bottom of the half shell have been clipped by the conical shape of the headlight element.

FIGS. 20A-D are plots depicting combined beam forming in one embodiment. The unidirectional dart beam show here is the result of multiplying beams shown in FIGS. 17A-E with a unidirectional headlight beam. The dart beam is shown here, but the same can be done with the tile beam.

Elemental figure-8 beams or pure cardioids can be multiplied together but because the elemental beams have no regions of pure rejection, the resulting beams always have lobes are not as useful as the beams realized so far with perfect cancellations through subtraction. If the nth power root to get back to a linear signal is not taken, the pattern is very sharp, which can be useful in direction finding applications.

Figure 21:
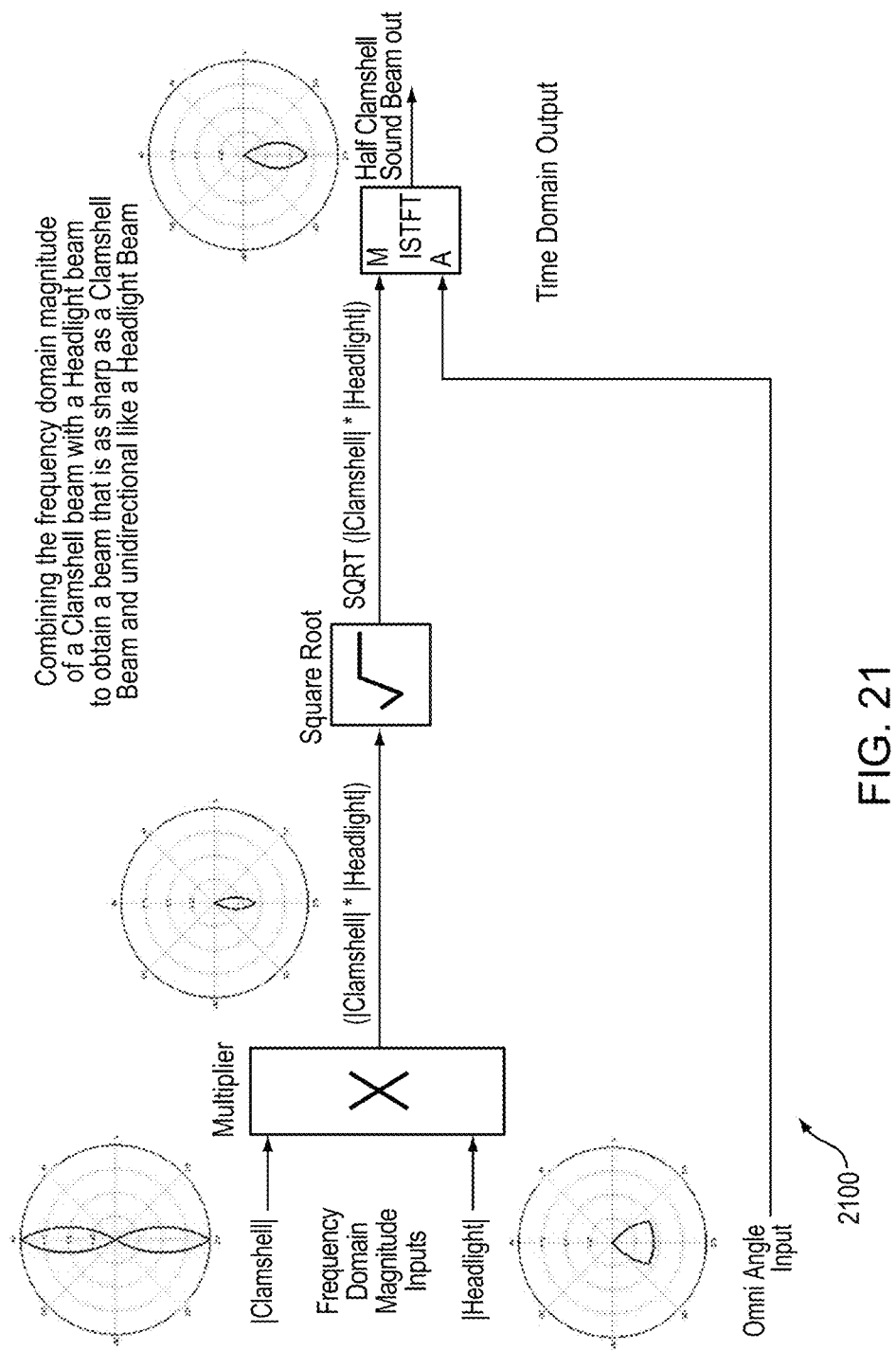
FIG. 21 is a diagram of a circuit providing combined beam forming in one embodiment.

FIG. 21 is a diagram of a circuit providing combined beam forming, which may be implemented in the signal processor 620 described above. A multiplier may receive and multiply clamshell and headlight beams as frequency domain magnitude inputs, and generate a corresponding combined beam. A square root block may then perform a square root operation of the combined signal, and an ISTFT block may output the resulting half clamshell flux beam.

Figure 22:
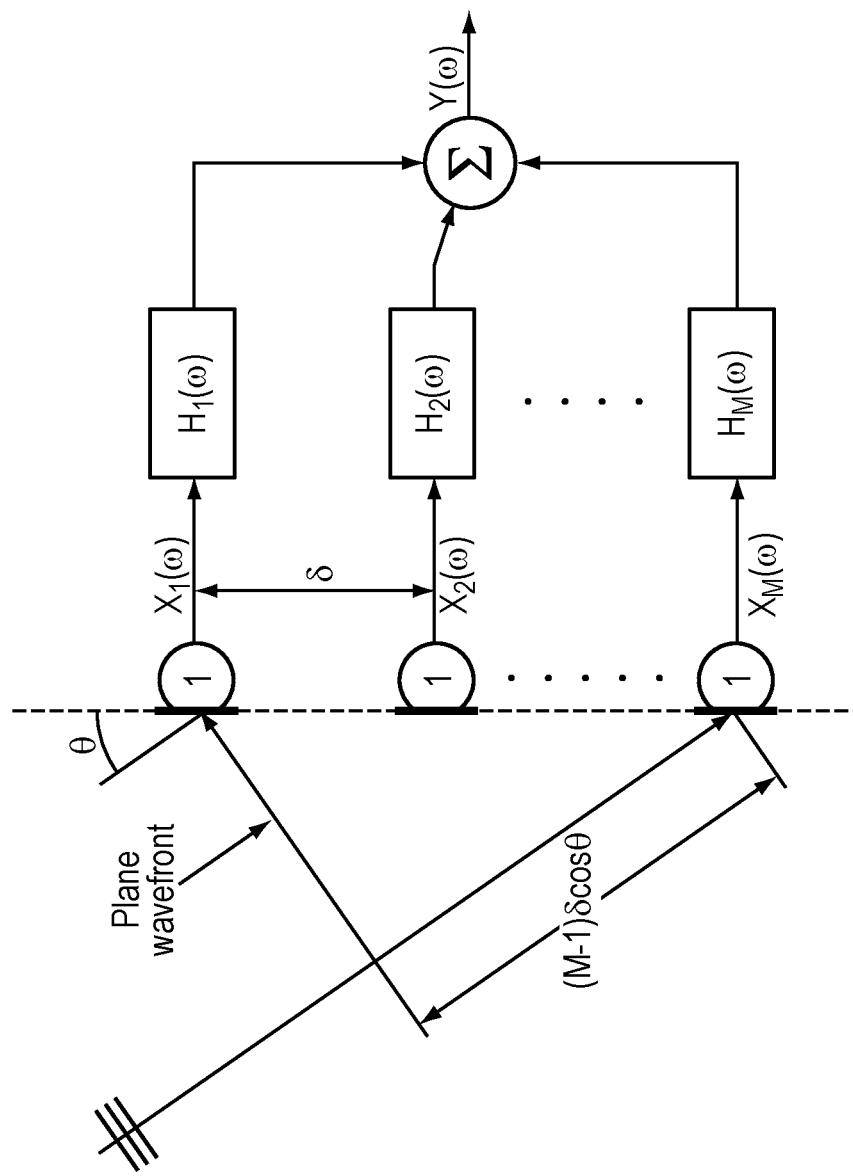
FIG. 22 is a diagram illustrating processing of sound waves via a microphone array in one embodiment.

FIG. 22 is a diagram illustrating processing of sound waves via a microphone array in one embodiment. The sound velocity flux can be calculated as the spatial differential of the sound pressure at a given point. An approximation of this differential is a first difference between two points in space. This approximation of the velocity flux from the difference between pressures at two points may require frequency equalization for flat frequency response. Taking the velocity flux and sound pressure from the same set of microphones makes the pressure and velocity measurements highly correlated and reduces the effects of microphone mismatch.

Mems microphones make ideal point sound pressure sensors, because their mm scale is small compared to practical microphone pairs down to 1 cm and is also small compared to the wavelength of sound. A velocity-sensing mems microphone would then eliminate the need for the space of a 1 cm mems microphone pair and would eliminate the bandwidth limitations of a microphone pair. This would bring sound beam forming down to the millisopic level and further increase immunity from any near field effects.

The mems microphone array model shown in FIG. 22, and basic equations as known in the art make a convenient model for beam forming calculations with a parallel flux. Experiments have shown very good performance in the near field down to 9 inches (23 cm). This means low sensitivity from pressure/velocity impedance variations and curvature of the flux. See Messner, E 2013, "Differential Microphone Arrays," Master's Thesis, Graz University of Technology, Graz, the entirety of which is incorporated herein by reference.

There are two fundamental methods to create an end-fire hypercardioid pattern. One method, which is most common in conventional beam forming is to add a process delay to one of the microphone signals before taking their difference. Another method which was first used to make cardioid microphones in the 1930's is to add the signal from a collocated omnidirectional microphone to a figure-8 velocity flux microphone. As will be demonstrated, the old method of adding omni to figure-8 has much wider bandwidth and much less beam degradation with frequency than the popular modern process delay method.

Figures 23A, 23B, 23C:
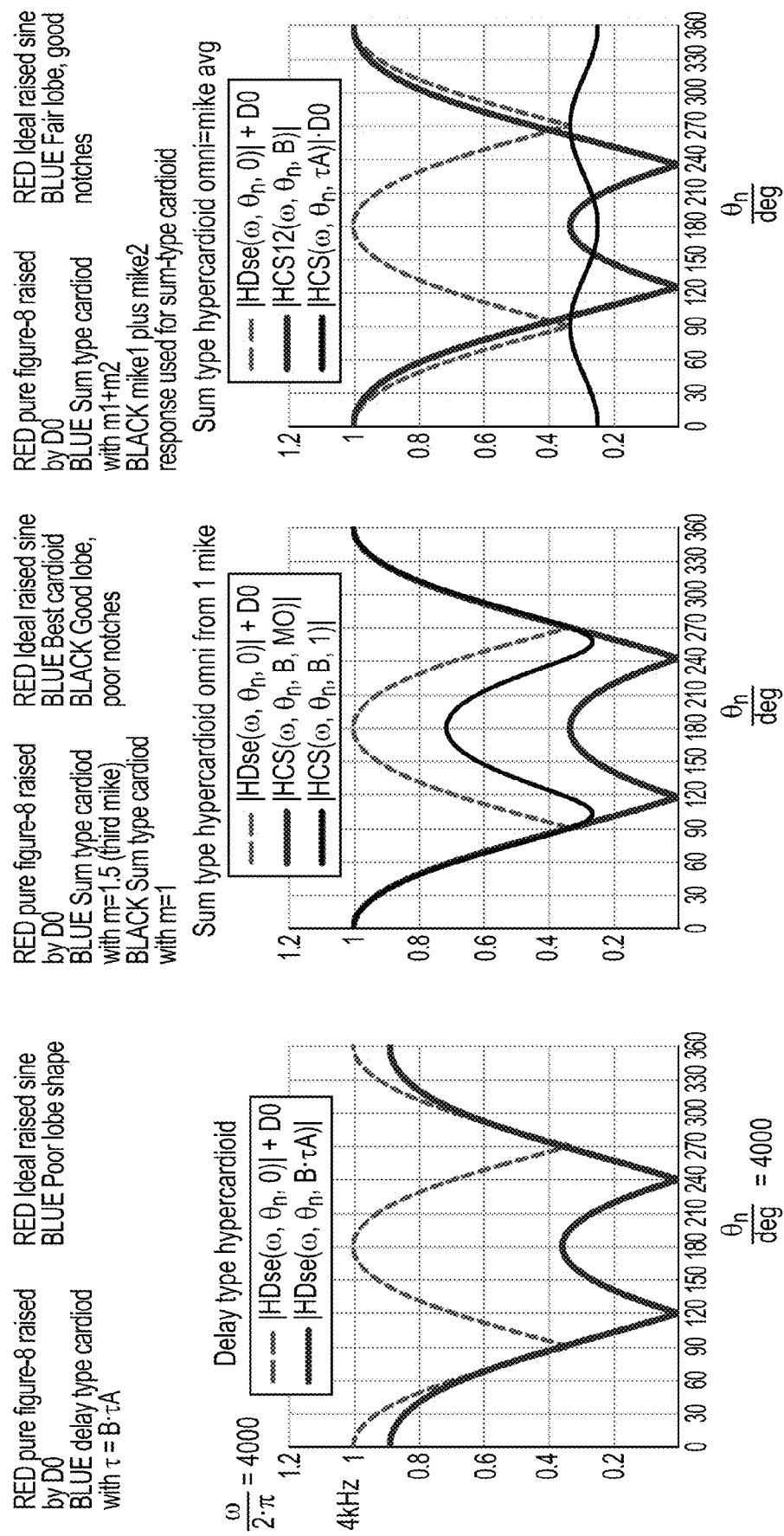
FIGS. 23A-C are plots depicting hypercarioid signals in one embodiment.

FIGS. 23A-C are plots depicting hypercarioid signals in one embodiment. The most important characteristic for flux beam forming is the back lobe conformity between the various elemental figure-8 or hypercardioid beam shapes. This ensures zero leakage in the beam rejection zone when the elemental magnitude shapes are subtracted. The back lobe in the following plots is at 0°/360°. 4 kHz is the aggressive test audio frequency that is nearly half the 8575 Hz half wave frequency of the microphone pair dipole separated by d=2 cm.

FIG. 23A shows the delay-type hypercardioid in the blue trace, which loses lobe conformity rapidly with frequency. In FIG. 23B, for omni-type cardioids with the omni content from a single microphone, the lobe conformity is good if one of the microphones is used, but the notch performance is poor in the black trace. The ideal omni source would be a third microphone located halfway between the two microphones with excellent lobe conformity over frequency and sharp notches in the blue trace. This is the best case. As shown in FIG. 23C, a good compromise between lobe conformity and sharp notches for the sum-type hypercardioid that does not require a third microphone. It obtains the omni signal from a sum of the two microphones as shown in the blue trace of the last plot. These effects all worsen with frequency. This example is at 4 kHz for a 2 cm microphone pair.

Figure 24:
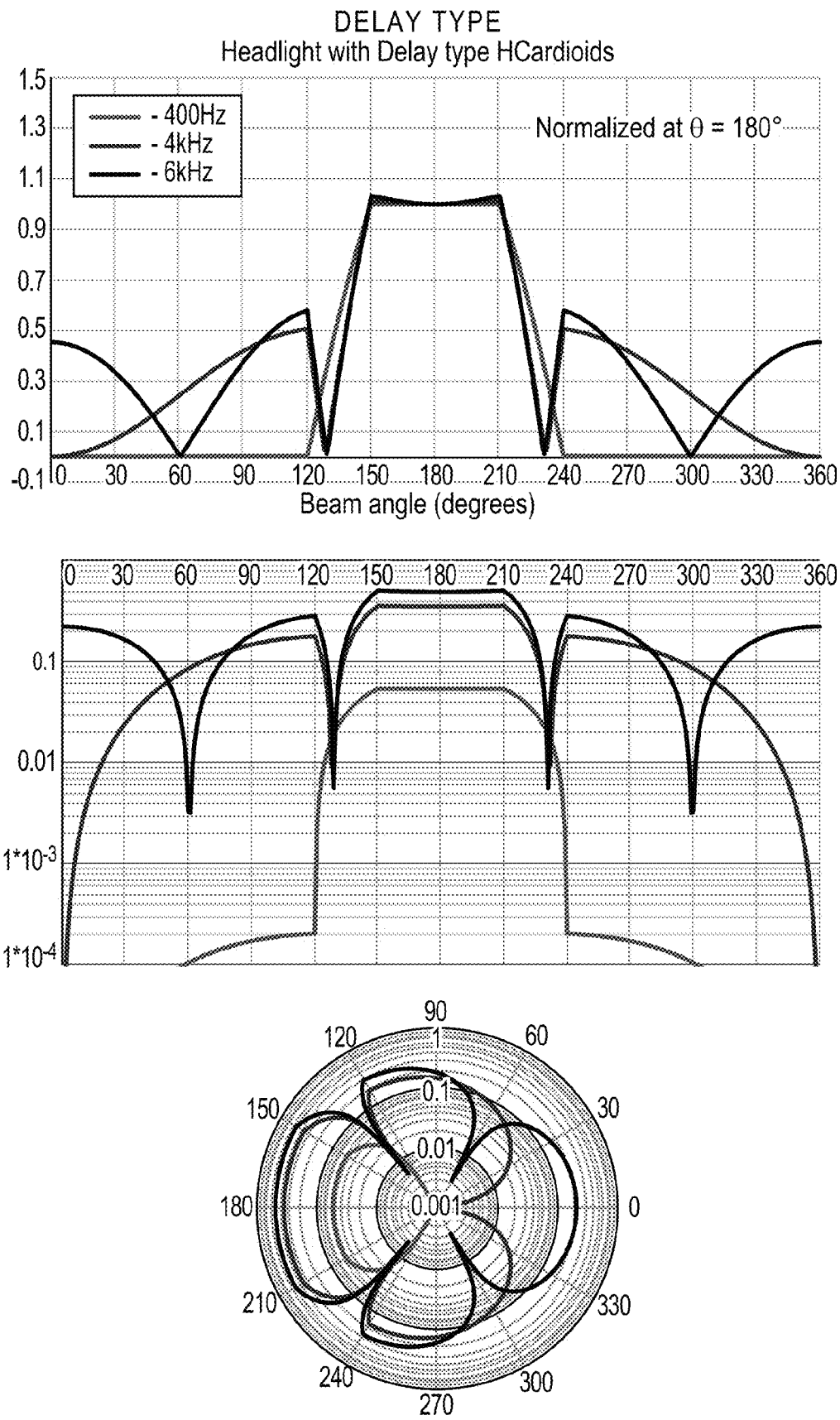
FIG. 24 is a set of plots depicting a headlight beam formed with delay type hypercardioid microphones in one embodiment.

FIG. 24 is a set of plots depicting a headlight beam formed with delay type hypercardioid microphones in one embodiment. Headlight beam performance is directly related to the performance of the constituent elemental hypercardioid beams. The most common type of hypercardioid is made by adding a process delay to the difference between microphones. However, this type of hypercardioid degrades quickly with frequency and so does the resulting headlight beam as shown.

FIG. 25 is a set of plots depicting a headlight beam formed with sum type hypercardioid microphones in one embodiment. Sum type hyper cardioids are done by adding controlled and equalized amounts of omni signal to the straight figure-8 microphone difference. In the best case the omni content comes from a 3rd microphone place half-way in the microphone pair. The resulting headlight beams are virtually independent of frequency, even at 6 kHz with a half-wave frequency of 8575 Hz from a 2 cm microphone pair gap.

FIG. 26 is a set of plots depicting a headlight beam formed with sum type hypercardioid microphones in a further embodiment. A good compromise for the sum-type hypercardioids is to derive the omni content from the sum of the two microphones in the pair. note that there is no degradation at all off-beam with this compromise. The on-beam shape degrades only very slightly.

Figure 27:
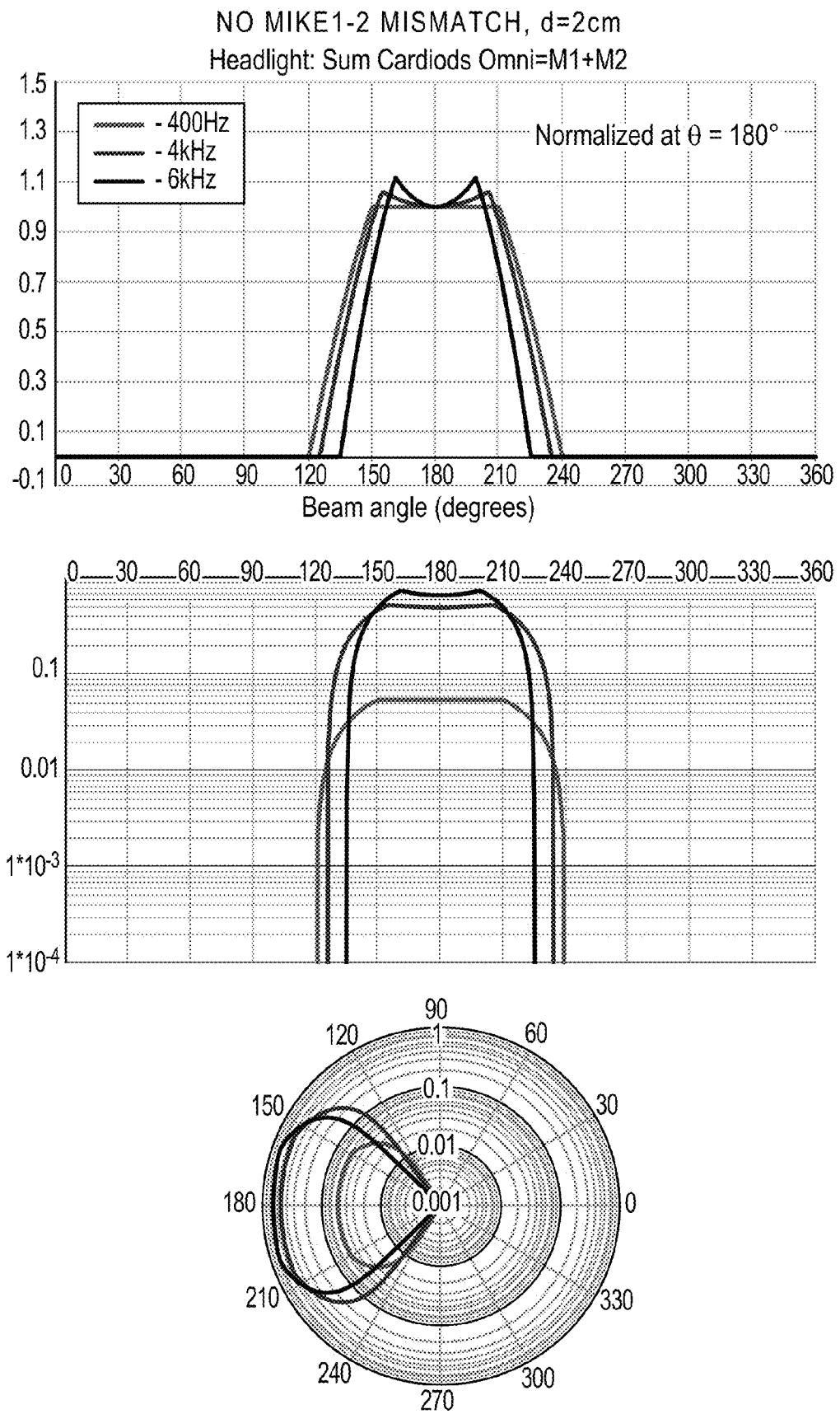
Figure 29:
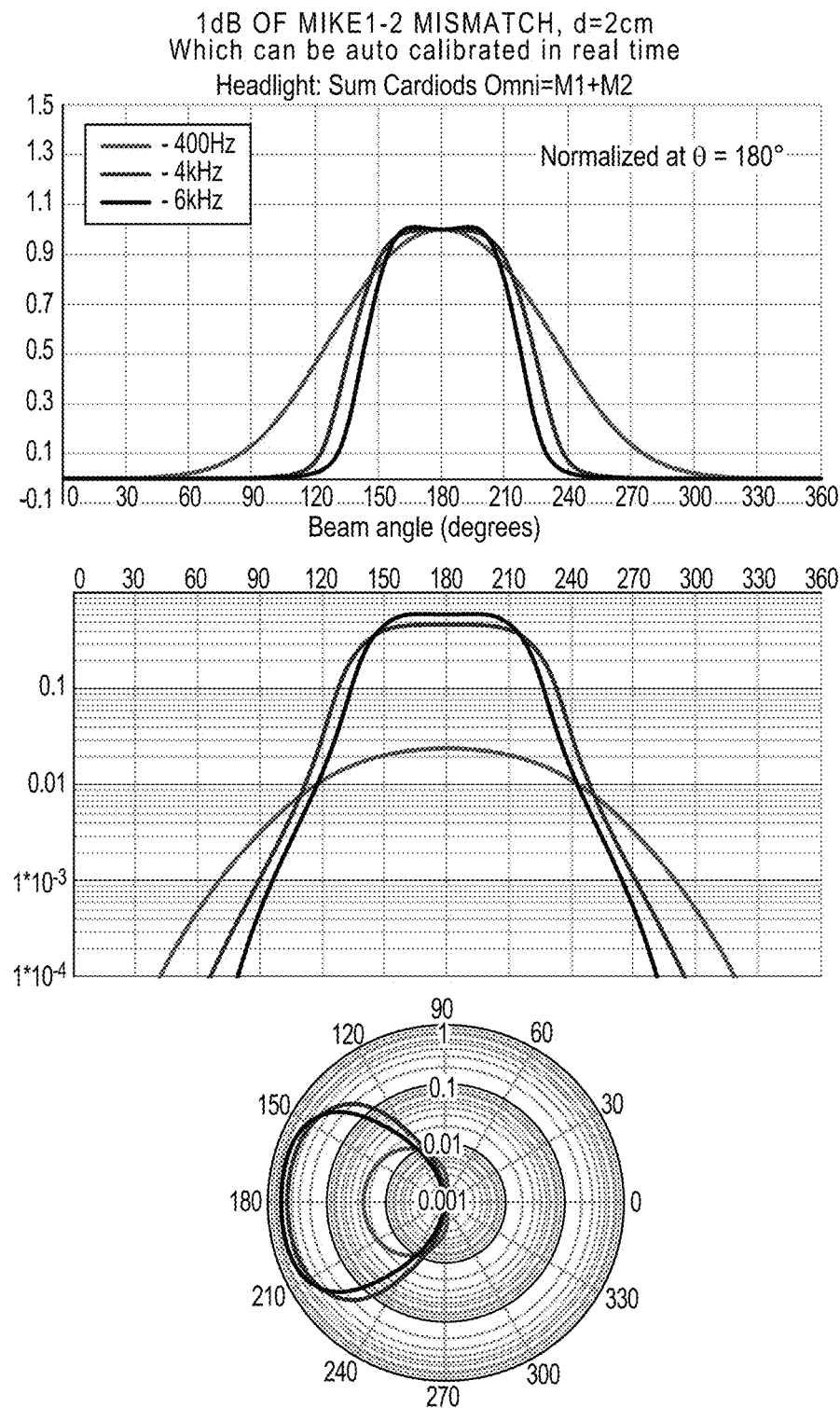

FIGS. 27-29 are plots depicting the effects of microphone mismatches. Headlight beams with elemental hypercardioids of the omni-sum type with the omni content taken from a sum of the two microphones M1+M2. There is negligible effect at high frequencies. Most of the mismatch effect is felt at low frequencies and results in a softening of the transition from on-beam to off beam. Note that no new back lobes appear.

FIGS. 30-31 are plots depicting headlight beams via an elemental sum type hypercardioid with omni sum from two microphones. This beam exhibits high sensitivity, flat nose, and no leakage off beam. Frequency is indicated by the curve color as in FIGS. 24-29 (Red: 400 Hz, Blue: 4 kHz, Black: 6 kHz). Component cardioids show great lobe distortion at 6 kHz, but the distorted lobes match between the elemental hypercardioids so that the headlight is still flat without leakage. 30° skirts, except for widest and narrowest beams with 20° skirts.

Figure 32:
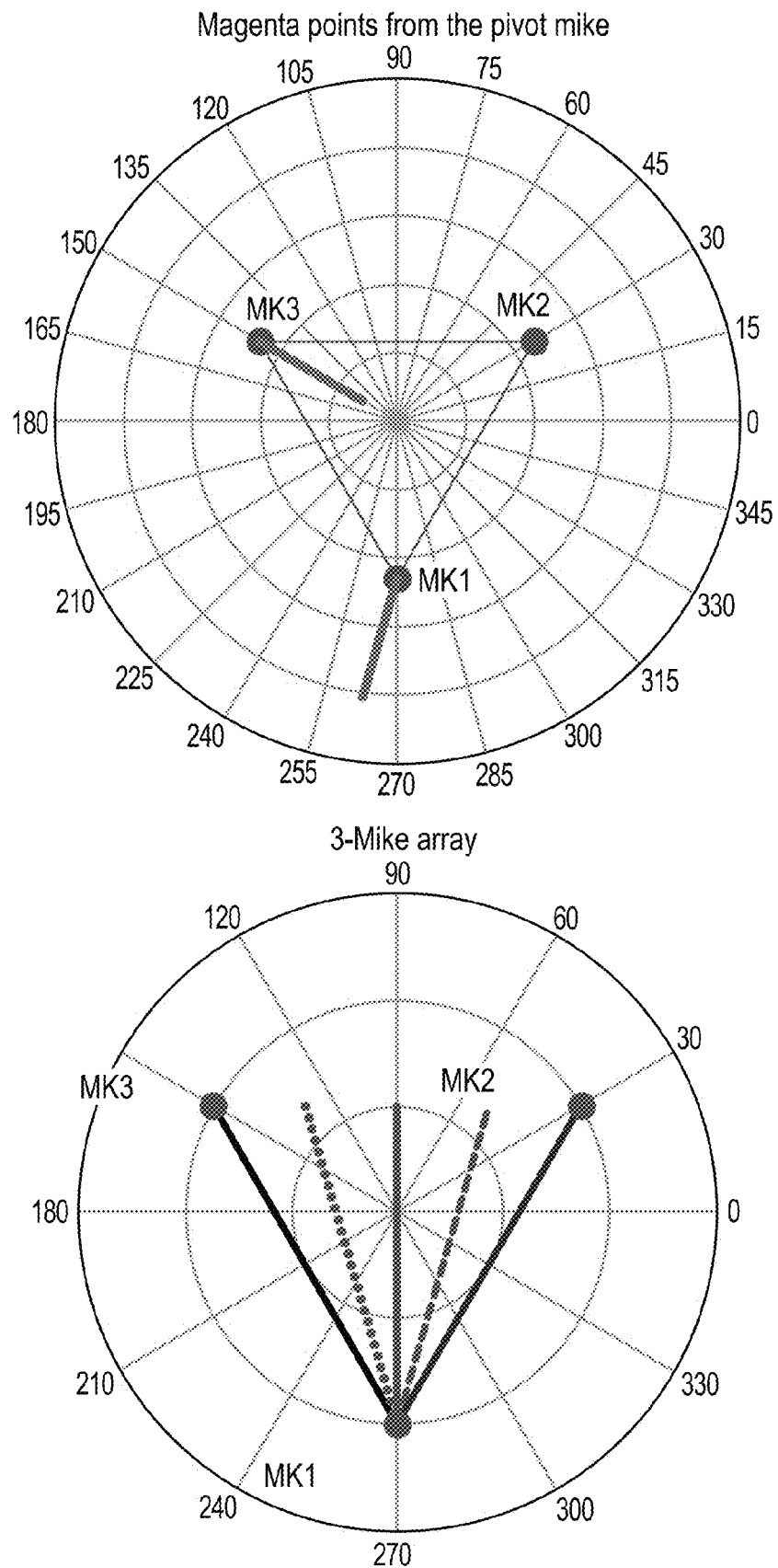
FIG. 32 is a set of plots depicting a 3-microphone array in an example embodiment.

FIG. 32 is a set of plots depicting a 3-microphone array in an example embodiment. One additional microphone arranged in an equilateral triangle with the two-microphone array enables flux beam polar rotation on the plane of the triangle. Optionally, a fourth microphone above the triangle, arranged in an equilateral pyramid enables spherical rotation. Polar rotation in a plane is described herein, but the same principle applies for spherical rotation. Polar rotation of the flux beam is calculated with one microphone in the triangle serving as the pivot point and a virtual rotated microphone is obtained with interpolation between the other two microphones. The difference between the pivot microphone and the rotated virtual microphone creates a correspondingly rotated figure-8 flux beam.

This interpolation rotates the flux beam over a 60° range between the two microphone pairs with a common pivot microphone. The opposite direction is calculated by reversing the beam direction with a simple sign reversal to get rotation over the opposing 60° arc. Full 360° rotation is accomplished by changing the pivot microphone to the other two possible positions in the triangle. When a particular beam rotation is desired, the angle is quantized into 6 sectors, to select the pivot microphone, the beam direction and portion of 60° to be interpolated.

The top plot shows two examples of rotation. In one case the pivot microphone is MK1. The interpolated microphone rotates the beam −15° from the halfway point between MK2 and MK3 and the calculation further reverses the beam resulting in a beam pointing to 255°. In the other case, the pivot microphone is MK3. The interpolated microphone rotates the beam to the halfway point between MK1 and MK2 for a beam pointing to 330°.

In flux beam rotation all the rotational information is provided by the elemental figure-8 beams that comprise the desired beam. The most important figure of merit in the quality of the rotation is circular lobe conformity and symmetry in the elemental figure-8 patterns. This lobe conformity, as described above when comparing sum-type cardioids to delay type cardioids is essential to minimize response off-beam. The worst case for off beam response of a headlight shaped beam is with rotation exactly halfway between the two interpolated microphones. The worst case calculated off-beam response for a headlight beam with a 60° wide peak, formed with a 1 cm 3-microphone array, is at 1 kHz equal to −95 dB from the peak of the beam, at 4 kHz it is −70 dB and at 8 kHz it is −50 dB.

The bottom plot shows examples of rotation in 15° steps. These rotation examples will be used in the beam response plots described below.

Figure 33:
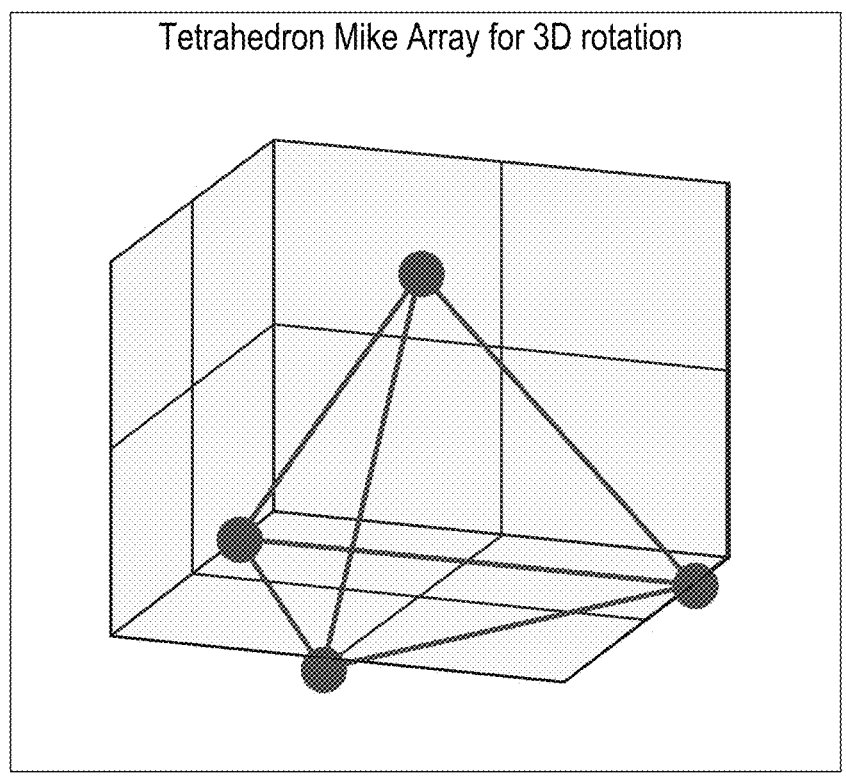
FIG. 33 illustrates a tetrahedron microphone array in an example embodiment.
Figure 34:
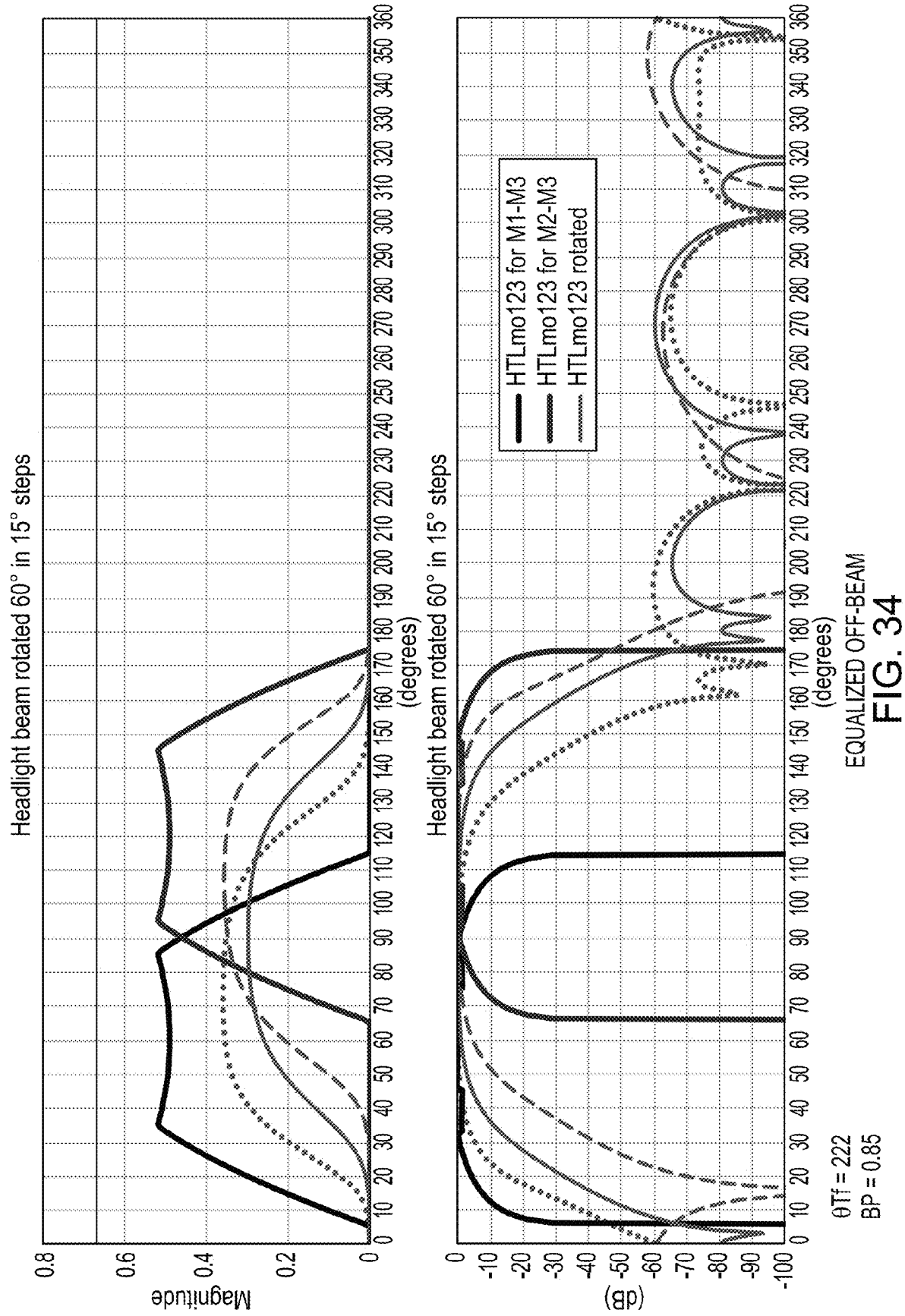

FIG. 33 illustrates a tetrahedron microphone array in an example embodiment. For 3D rotation a minimum of 4 microphones are needed to get rotation into the 3rd physical dimension. Most convenient and efficient is the regular Tetrahedron. However, any number of microphones greater than or equal to 4 that encompass a solid are capable of at least some practical rotation.

Smaller rotation artifacts are obtained by increasing the number of microphones. For example, the planar array should have an odd number of microphones disposed on a circle for simplest symmetric interpolations. A 5-microphone array on the vertices of a regular pentagon may require interpolation inside only 36°, which is nearly half the interpolation range of 60° for a triangular array. For the 3D array, the most convenient and efficient microphone arrays have faces that are all equal polygons with odd vertex count and with an opposing vertex centered on each face.

FIGS. 34-38 are plots depicting rotated headlight beams in one embodiment. For 3D rotation a minimum of 4 microphones are needed to get rotation into the 3rd physical dimension. Most convenient and efficient is the regular Tetrahedron. However, any number of microphones greater than or equal to 4 that encompass a solid are capable of at least some practical rotation.

Smaller rotation artifacts are obtained by increasing the number of microphones. For example, the planar array should have an odd number of microphones disposed on a circle for simplest symmetric interpolations. A 5-microphone array on the vertices of a regular pentagon may require interpolation inside only 36o, which is nearly half the interpolation range of 60° for a triangular array.

Figure 36:
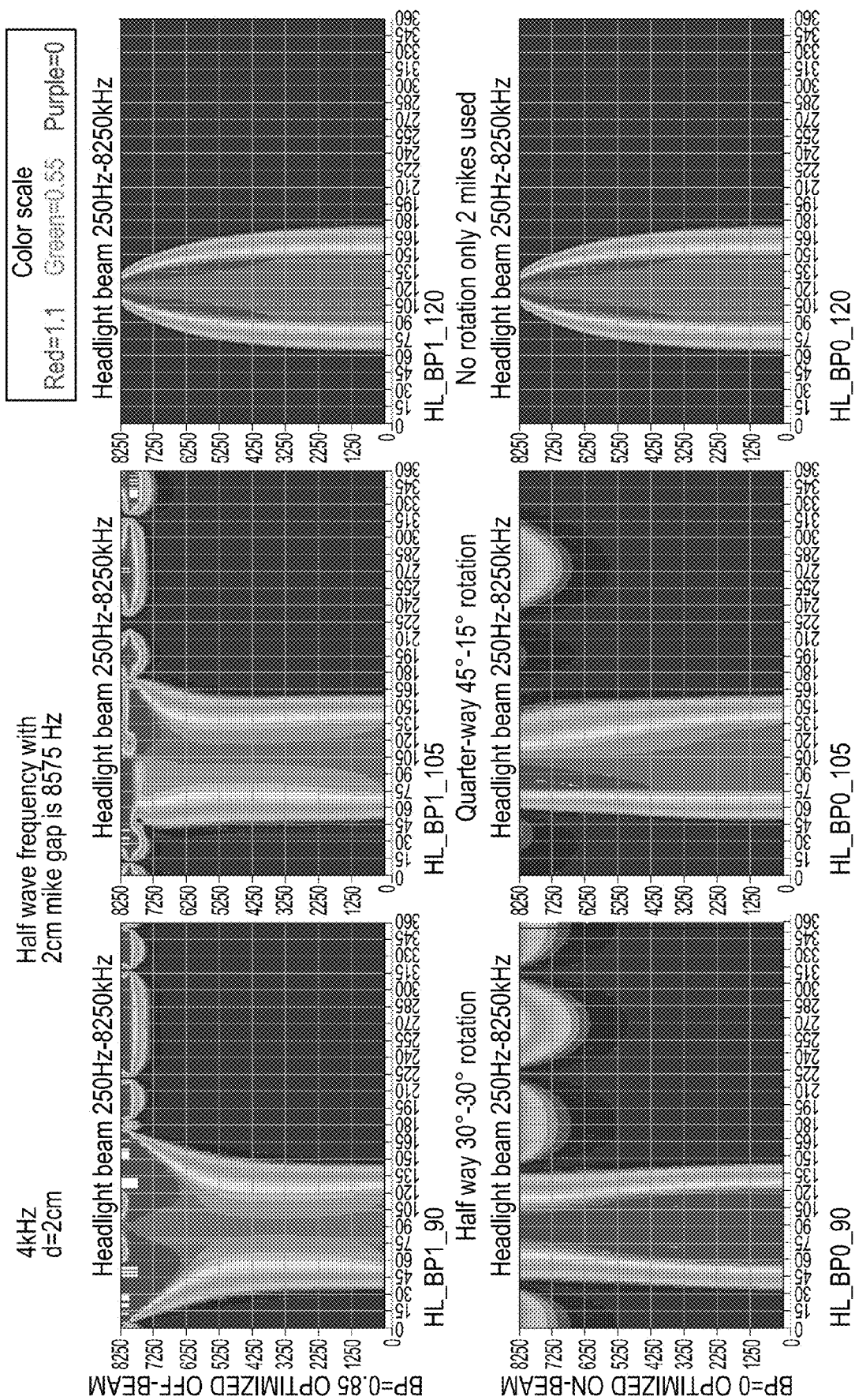

With reference to FIG. 36, Frequency sweep surfaces for three rotations. First halfway 30°-30° rotation between 60° and 120°, to 90°, then quarter-way 45°-15° rotation to 105° and on the right no rotation at all with only 2 microphones in use at 120°. The first row of surfaces were optimized off-beam with BP=0.85. The second row was optimized on-beam with BP=0. Note how BP has no effect when only two microphones are used. The beam output is equalized to nominal sensitivity of 1 at center-beam. The color goes from violet=zero to red=1.1.

Figure 37:
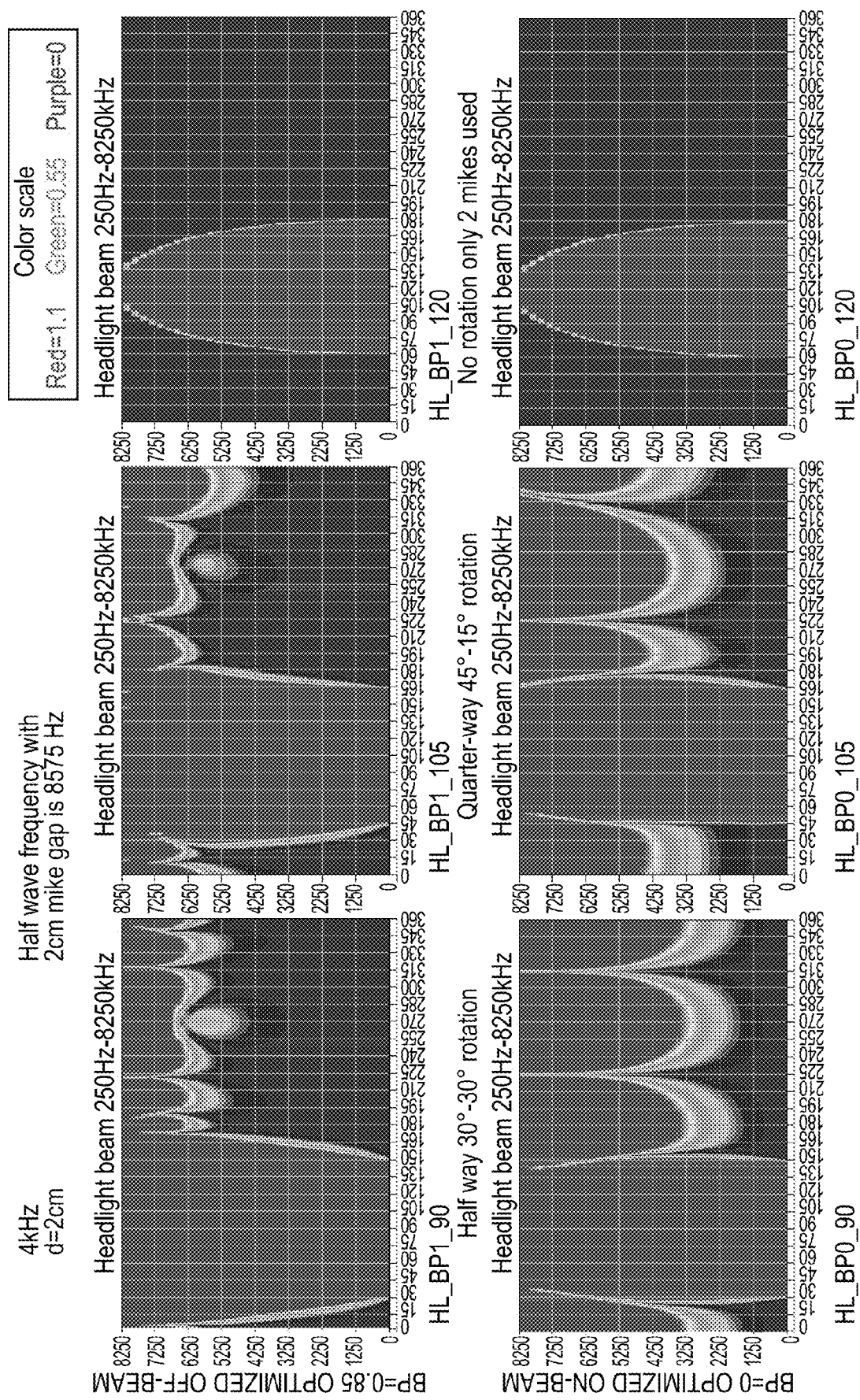
Figure 38:
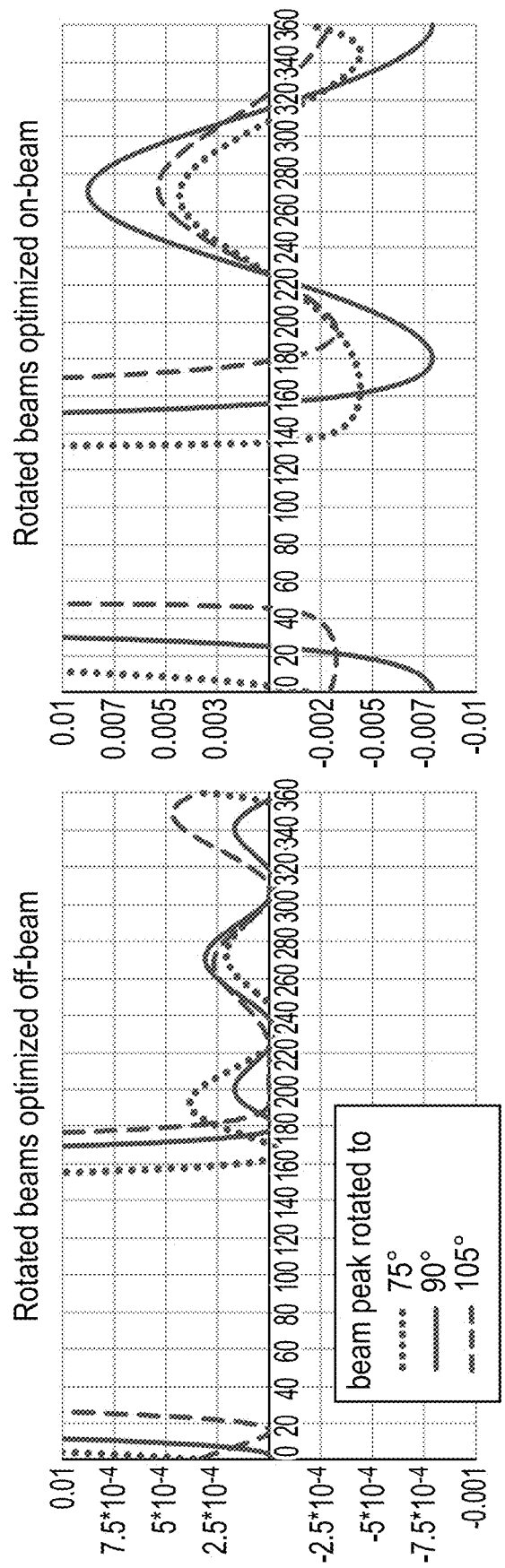

FIGS. 37 and 38 illustrate frequency sweep surfaces for three rotations. Now with the amplitude values clipped at 0.01 to show off-beam detail. Violet=0, Red=0.01 The off-beam performance is very good out to 6 kHz with a 40 dB rejection for both interpolated beams. The 2-microphone non-interpolated beam retains the expected infinite rejection off-beam. Shown in FIG. 38 is detail at 4 kHz of the off-beam region for BP=0.85 and BP=0 and three rotation angles in 15° steps, with the second angle at halfway interpolation.

Figure 39:
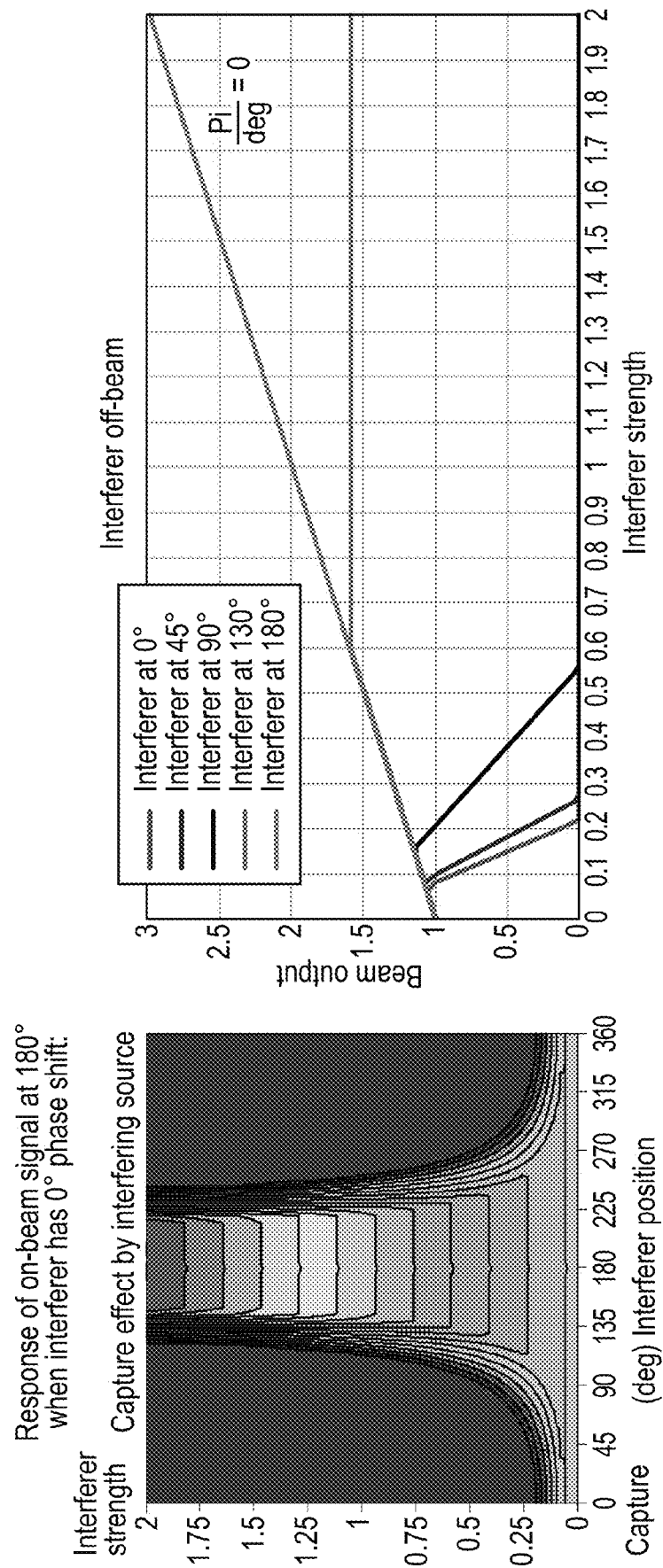
FIG. 39 is a set of plots illustrating a capture effect associated with a headlight beam in one embodiment.

FIG. 39 is a set of plots illustrating a capture effect associated with a headlight beam in one embodiment. When signals in the same frequency bin come from on-beam and off-beam directions simultaneously, a capture effect results such that a strong off-beam signal may null the on-beam signal. The temporal phase difference between the on-beam and off-beam signals affects the sum of the two signals as received by sensors as expected. As different magnitudes are received by the elemental figure-8, hypercardioid or omni beam shapes, their sums or differences will have a necessarily different result than at the sensor, because only magnitudes without consideration to phase or polarity are used in the final beam shape calculation. This results in the capture effect.

Refer again to the plot of FIG. 9C depicting a headlight beam in a horizontal plane cross section. The beam peak is at 180° and is 60° wide. The beam base is 100° wide. The color contour plot of FIG. 39 shows the response of a signal with nominal magnitude of 1 aimed at the center of the beam in the first plot, while a second interfering signal in phase with the desired signal at the beam peak is swept around the sensors over 360°.

The horizontal axis shows the position of the interfering source. The vertical axis of the contour plot is the amplitude of the interfering signal, which ranges from 0 amplitude at the bottom of the plot to 2 at the top of the plot. The color contours represent the output signal, which ranges from 0 with dark violet to 3 in red. Cyan is 1. The second plot shows vertical slices through the contour plot when the interferer is at 0°, 45°, 90°, 130° and 180°. At 0° in the brown trace, the interferer is at the same angle as the desired signal and therefore adds to it directly. At 180° in the red trace, the interferer is directly opposite the desired signal at the back of the beam. The capture effect means that the stronger signal wins. If the off-beam interferer is strong enough, it will null the signal in the beam. The strongest capture effect is seen here when the interfering source is directly opposite the signal at 0°. With the interferer at 0°, it nulls (captures) the main signal with an amplitude of 0.22. Note the red trace intercept at the x-axis of the second plot. Phase shift between the off-beam interferer and the on-beam signal also softens the capture effect, so that the suppression is not complete.

The capture effect provides a further benefit: Any random microphone noise spectra that appears off-beam reduces the amount of random microphone noise that reaches the output beam. One simulation was done with a 1 kHz tone aimed at a microphone triad and a headlight beam with a 100° beam width at the base and a 50° wide top was calculated. Each microphone had a 20 dB SNR vs the 1 kHz tone. The simple sum of the three microphones yields a 24.8 dB SNR. The output beam showed a 30.1 dB SNR when the rotation used only 2 microphones and 25.8 dB when the rotation resulted in a microphone interpolated halfway between two microphones. This 5.8-10 dB improvement over the noise of a single microphone was in part caused by the capture effect and in part caused by the beam forming that suppresses off-beam noise.

Figure 40:
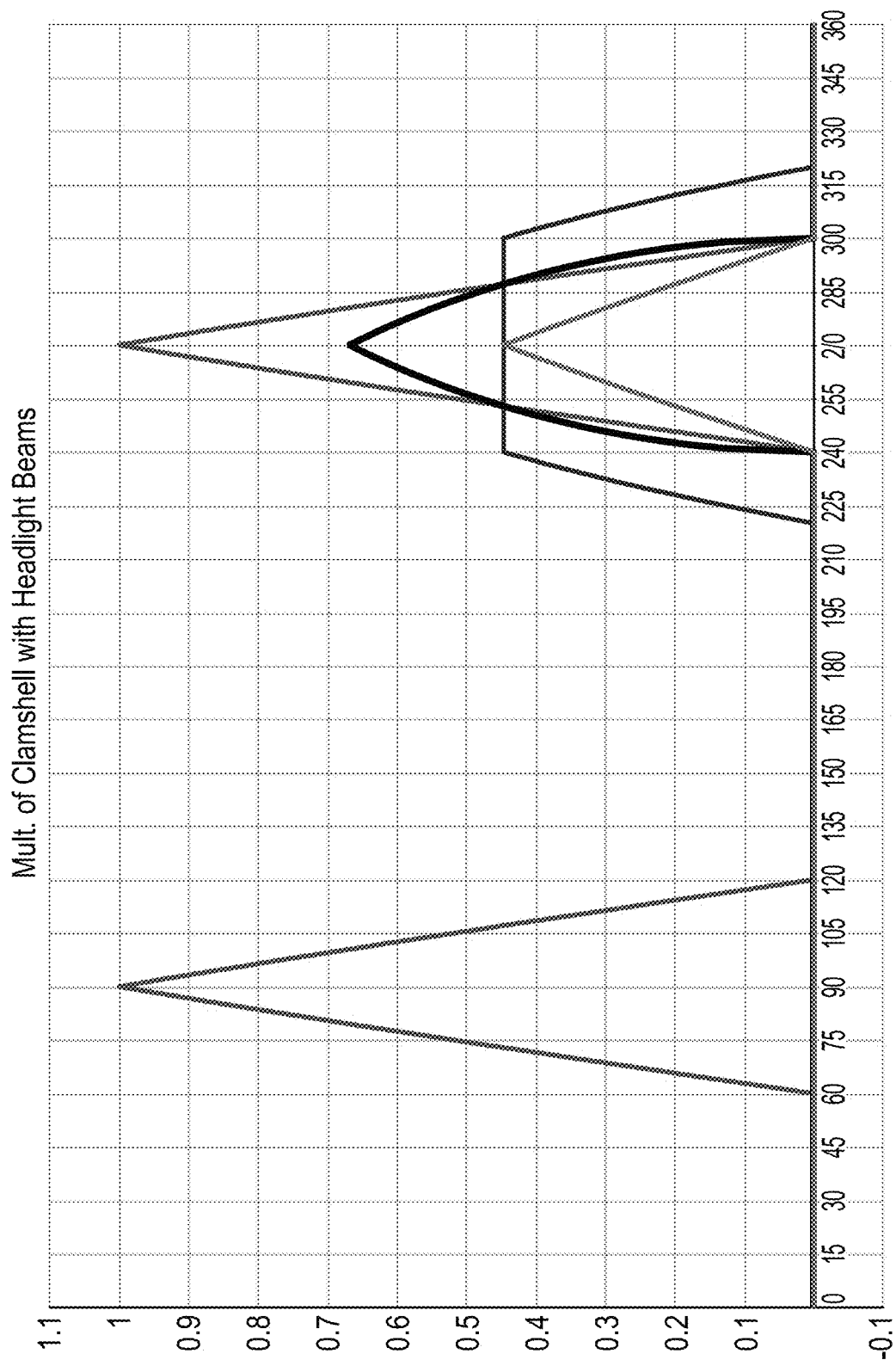
FIG. 40 is a plot depicting a multiplication of clamshell and headlight beams in one embodiment.

FIG. 40 is a plot depicting a multiplication of clamshell and headlight beam, comparable to the plot of FIG. 9C. In addition to the various beam types described above as inherently bidirectional or unidirectional, a third type of beam, described above, multiplies the magnitudes of these two beam types, still in the frequency domain, to produce a new type of beam that has qualities from both types of beams. The resulting beam is unidirectional, but retains the sharp peak characteristics that are possible with bidirectional beams. A square root factor may be applied if signal linearity is to be retained, but at the expense of some dulling of the sharpness of the beam. The plots show the elemental clamshell beam in red, the elemental headlight beam in blue and the resulting sharp unidirectional beam in magenta without the square root factor and in black with the square root factor to restore signal linearity.

A new useful property of these beams is that multiplying elemental beams to form a new beam does not produce the capture effect that is inherent in the folding nature of the beam forming with scaled sums of the magnitude in the frequency domain that is used in the other types of beams. With beam multiplication, the off-beam regions have additional rejection that is the sum of the two beam rejections in dB. If the square root is necessary to preserve linearity, the off-beam rejection is still better than either elemental beam, but it is not the geometric average of the two beams. In dB, the off-beam rejection is simply the linear average of the two beam rejections. Off-beam rejection is a moot point with beams that are not rotated because their off-beam rejection is extremely high, theoretically infinite. But rotated beams have high, but not infinite off-beam rejection and benefit from the additional off-beam rejection that comes with beam multiplication.

If reducing the capture effect is desired, using diversity reception with microphone arrays placed a significant distance apart where the phase relations are different between signals in the same frequency bin that come from different directions.

Figure 41:
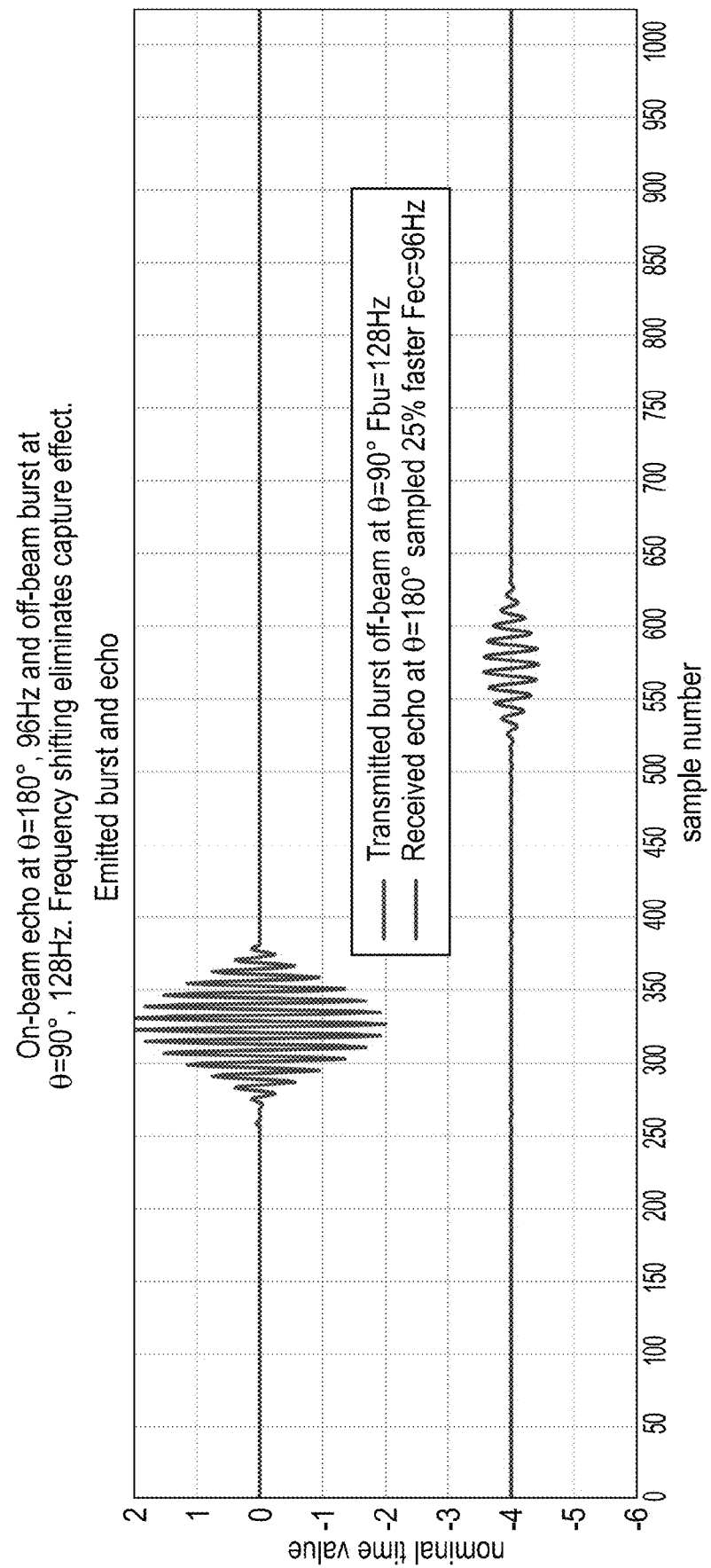
FIGS. 41-42 are plots depicting an emitted burst and echo in one embodiment.
Figure 42:
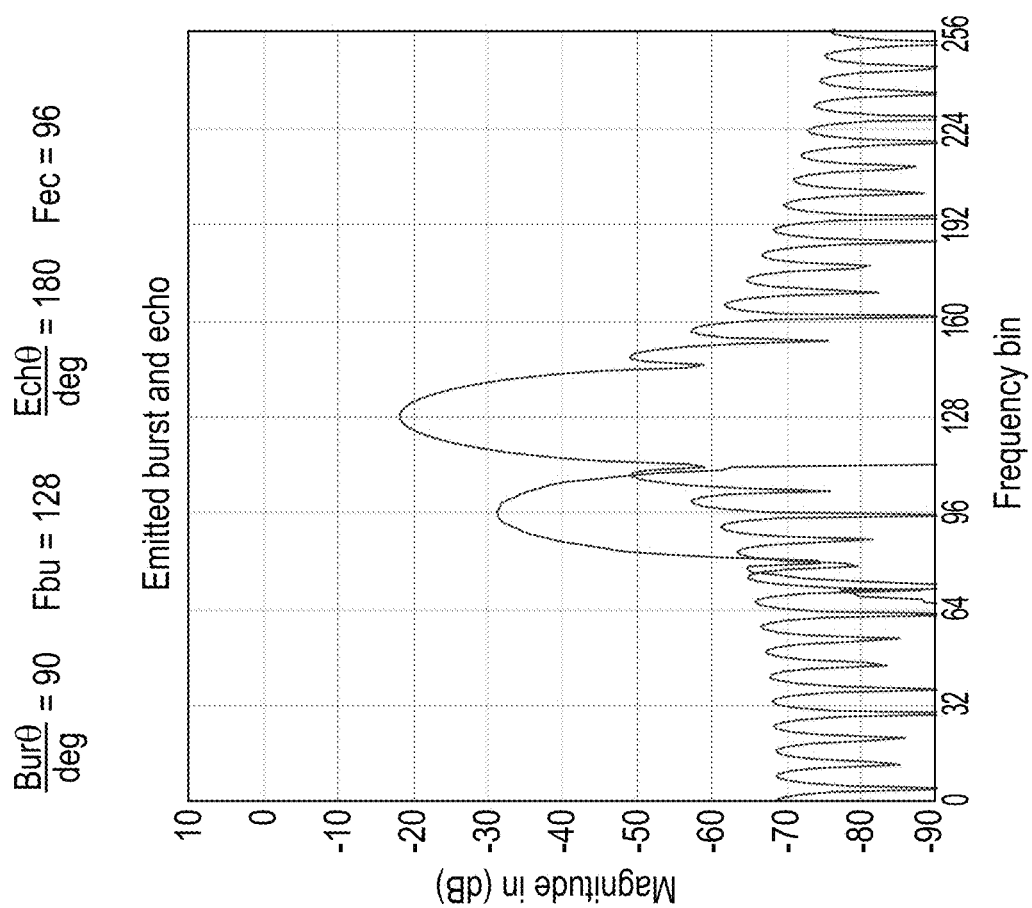

FIGS. 41-42 are plots depicting an emitted burst and echo in one embodiment. The capture effect has proven in tests to have an insignificant effect in audio speech applications because the off-beam sound sources are rarely at the same frequency or in close phase with the on-beam signal. The capture effect even has the advantage of suppressing speech reverberation that is weaker on-beam than off-beam. For ranging applications, however, the capture effect would cause an undesirable interaction between transmitted signals and the reflections being sensed, if these both fall in the same or overlapping STFT (Short Time Fourier Transform) records. The capture effect within in STFT record can cause an echo to be completely suppressed by the presence of the transmitted burst that is off-beam.

One way around this limitation in ranging applications is to shift the sample frequency during the collection record. One can simply have two sample frequencies with the lower sample frequency used during transmission and the higher frequency used during reception. This puts the transmitted and received signals in separate frequency bins. Smaller frequency shifts work too, but may be less convenient to realize. A further possibility is a continuous chirping of the sampling frequency, perhaps even with random sample dither or coherent sample dither. These techniques can be explored further.

Figure 43:
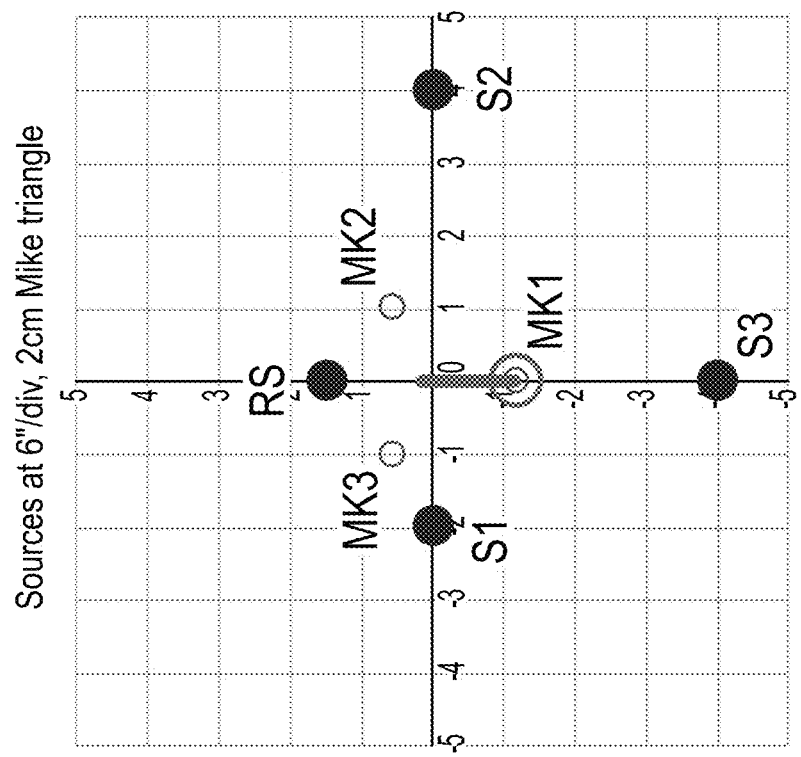
FIG. 43 is a plot depicting the position of multiple signal sources relative to a sensor array in one embodiment.
Figure 44:
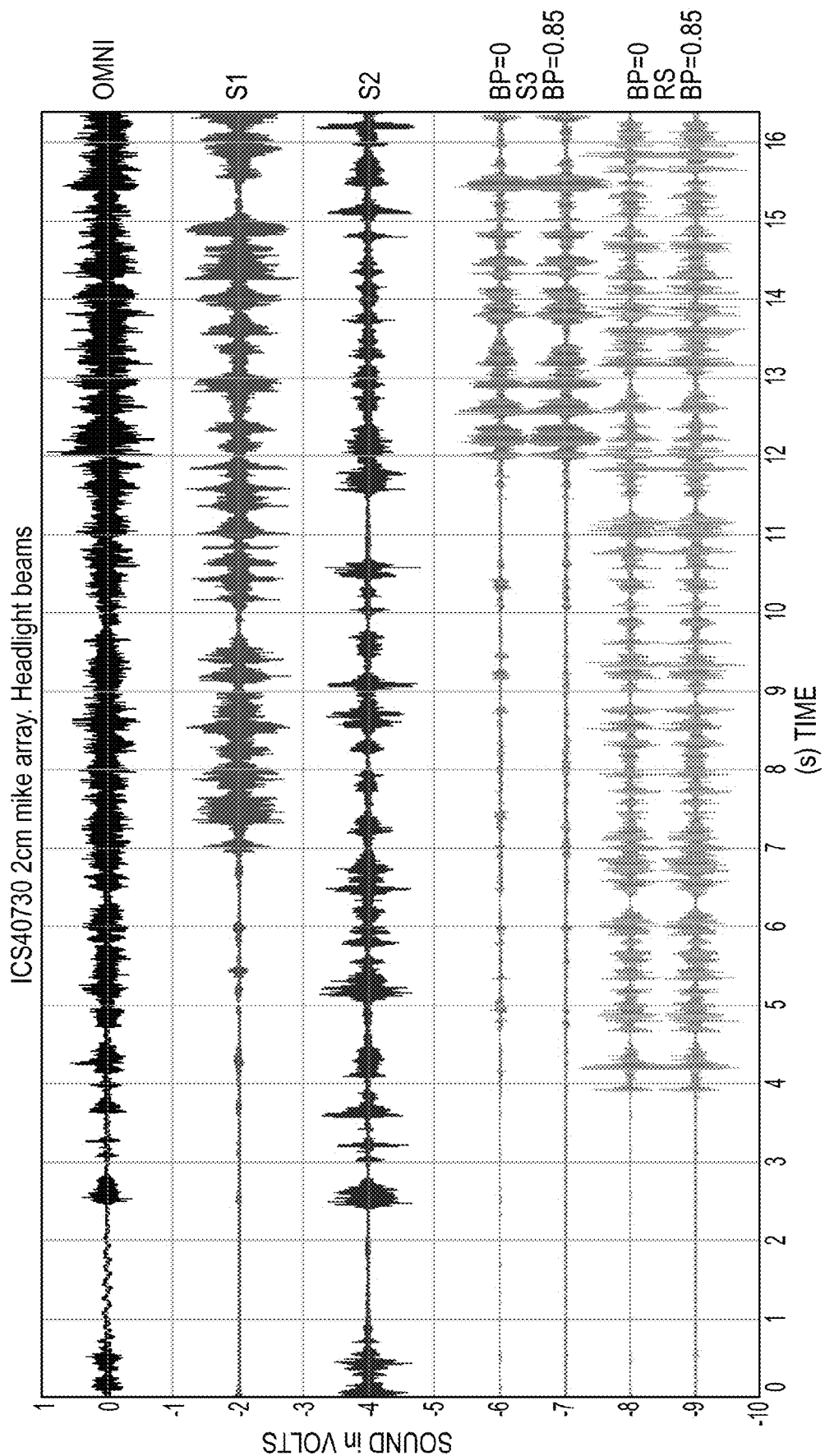
FIG. 44 is a plot depicting a set of signals detected by the sensor array shown in FIG. 43.

FIG. 43 is a plot depicting the position of multiple signal sources relative to a sensor array, and FIG. 44 is a plot depicting a set of signals detected by the sensor array shown in an example operation. The pivot microphone is circled in magenta, and the beam direction is shown as a magenta line. The sound sources are depicted as blue dots. Note that the RS microphone is only 6" from the 2 cm microphone triangle, thus making it particularly challenging to block the RS source when the beam is aimed at S3. Both of these sources are located at beam locations that are interpolated 30° from the adjacent microphone pair. But the results when the beam is aimed at S3 are remarkably good, as described below.

In an example test of a sensor and source configuration as shown in FIG. 43, four voices laid out at 90° angles around a triangular 2 cm mems microphone array were recorded in the example configuration described herein. The recording surface was a fairly acoustically inert wool quilt on a bed. The room is 16'×14' with 7.5' ceilings and wood floors. The bed surface was raised 2' from the floor. The wavefronts from the RS sound source arrive at the mems array with some curvature over the short 9" distance, but no effect was detected in the results.

The recording equipment consisted of three InvenSense ICS40730 mems microphones on a 2 cm triangle in a 5 cm disk fed via the 16 cm ribbon cable and the 80 cm twisted pair to the microphone power box with two AAA cells. This connects via 6"¼" shielded cables to the preamp and digitizer model iConnectAudio4 from iConnectivity. The digitizer connects via USB cable to the Surface GO tablet running the Reaper Digital Audio Workstation software. The DAW software collects the raw sound file, which is later processed with flux beam forming in my personal PC laptop with MathCAD 6.0.

The setup was calibrated for gain match with a 440 Hz tone radiated from a small self-powered speaker about one foot directly above the mems microphone array disk. The microphone mismatch was under 2% (0.2 dB). This calibration step was not necessary as the results are indistinguishable with or without microphone gain calibration.

The headlight shaped beams were constructed from the difference of the frequency domain amplitudes of two hypercardioid beam shapes as outlined earlier. One hypercardioid has its notches at +/−50° and sets the 100° wide base of the headlight beam, giving a 260° off-beam region with extremely deep rejection. The other hypercardioid has a major lobe that closely matches the first hypercardioid to create the off-beam rejection zone. It has its notches at +/−15° and serves to create the flat peak of the beam that is 30° wide. The beam width is very non-critical with very similar results for substantially different beam base widths and flat top widths.

The S1 and S2 sound sources were aligned with the microphone2-microphone3 dipole, so the headlight beam was calculated in opposite directions without rotation. The S3 and RS sound sources were aligned with microphone1 and halfway between microphones 2 and 3. This required maximal 30° beam rotation, which produces worst case headlight beam degradation at high frequencies as a result of the beam interpolation required by the rotation. The results however were still comparably good to the unrotated results for S1 and S2. In particular, the worst side lobe results described above (i.e., −35 dB at 4 kHz) is still far better than what is obtainable with standard phased array beamforming techniques.

When the beam is not rotated, only the signal from two microphones is used in the beam forming. The headlight shape is thus nearly perfect over a wide frequency band (refer to the frequency and angular sweep plots described above with reference to FIGS. 40-42) and is the best case for beam shape. The rejection in the off-beam region is theoretically infinite and in practice indistinguishably so. Rotated beams degrade at high frequencies, but can be optimized for on-beam shape or for off-beam rejection, or a mix of both. The results that extracted the S3 sound source with the 30° beam rotation between MK2 and MK3 showed an audible difference in the quiet passages when the rotated beam was optimized for best beam sharp edged shape with an off-beam rejection of only (<−35 dB @4 kHz) versus for maximal rejection (<−61 dB @4 kHz) (See FIG. 39). This difference is visible in the magenta traces of the time domain plot of FIG. 44, with the first magenta trace optimized for on-beam shape and the second magenta trace optimized for maximal off-beam rejection. The optimization for on-beam or off-beam response is done by selecting at what rotation angle θTf, is the frequency response of the elemental hypercardioids and the elemental omni sum calculated, which is then applied to the combination of the magnitudes of the elemental shapes.

For best on-beam shape, the frequency response for equalization of the hypercardioids may be calculated at the center of their minor lobes, which become the center of the (<180 wide) headlight beam. In the case of the 30° beam rotation/interpolation for the S3 and RS sound sources, the best on-beam response calculation is for angle θTf=90°. For best off-beam rejection, the rotation is selected to minimize the residual off-beam lobes. In this case the selected rotation for best off-beam rejection was at angle θTf=225°.

While example embodiments have been particularly shown and described, it will be understood by those skilled in the art that various changes in form and details may be made therein without departing from the scope of the embodiments encompassed by the appended claims.

What is claimed is:

1. A method comprising:
    detecting, via a sensor array comprising a plurality of sensors, a plurality of flux signals, the plurality of flux signals being synchronous and each representing a surface integral of a vector field of one of an electromagnetic flux and a sound flux;
    generating a plurality of flux patterns based on the plurality of flux signals, each of the plurality of flux patterns representing a respective one of the plurality of flux signals;

generating a plurality of flux magnitude patterns based on the plurality of flux patterns, each of the plurality of flux magnitude patterns representing an absolute value of a respective one of the plurality of flux patterns; and
generating a flux beam as a function of the plurality of flux magnitude patterns.

2. The method of claim 1, wherein the flux beam is a result of a mathematical operation comprising exclusively at least one of an addition and a subtraction of the plurality of flux magnitude patterns.

3. The method of claim 1, wherein the plurality of flux signals is one of magnetic fluxes, light fluxes, and radio frequency magnetic flux signals.

4. The method of claim 1, wherein the sensor array includes at least two microphones, the plurality of flux signals being sound velocity fluxes.

5. The method of claim 4, wherein sound velocity fluxes are based on a spatial difference of a sound pressure measured by the at least two microphones.

6. The method of claim 4, wherein the at least two microphones are one or more of an omnidirectional microphone, a figure-8 velocity microphone, a cardioid microphone, a hyper-cardioid microphone, and a super-cardioid microphone.

7. The method of claim 1, wherein generating the plurality of flux magnitude patterns includes processing each of the plurality of flux signals via a Fourier transform.

8. The method of claim 7, wherein generating the flux beam includes processing a signal representing the plurality of flux magnitude patterns via an inverse Fourier transform.

9. The method of claim 1, wherein the plurality of flux signals is a subset of flux signals detected by the sensor array, the subset of flux signals having a common frequency.

10. The method of claim 9, wherein the common frequency is zero.

11. The method of claim 9, wherein the subset is a first subset, and further comprising:
generating a subsequent flux pattern as a function of a second subset of flux signals having a common frequency that is distinct from the frequency of the first subset.

12. The method of claim 9, wherein the flux pattern is a result of at least one of a linear sum and a linear difference of magnitudes of the subset of flux signals.

13. The method of claim 9, wherein the flux pattern is a result of at least one of a sum, a difference, and a multiplication of magnitudes of the subset of flux signals in a frequency domain.

14. The method of claim 9, wherein the flux pattern is a result of at least one of a sum, a difference, and a multiplication of magnitudes of the subset of flux signals in an inverse of a frequency domain, the inverse of the frequency domain being at least one of a time domain and a space domain.

15. The method of claim 1, wherein the flux beam is a first flux beam, and further comprising:
combining a magnitude of the first flux beam with a magnitude of a second flux beam via a multiplication operation to generate a combined flux beam.

16. The method of claim 15, wherein the combined flux beam is a function of a square root of the multiplication of the first flux beam and the second flux beam.

17. The method of claim 15, wherein the first flux pattern is a unidirectional beam and the second flux pattern is a bidirectional beam.

18. The method of claim 15, wherein the first flux pattern is a bidirectional beam and the second flux pattern is a bidirectional beam.

19. The method of claim 15, wherein the first flux pattern is a unidirectional beam and the second flux pattern is a unidirectional beam.

20. The method of claim 1, wherein the sensor array includes three sensors positioned at points of a triangle, and further comprising:
assigning a first sensor of the three sensors as a pivot; and
generating a virtual plane-rotated sensor via linear interpolation between a second sensor and a third sensor of the three sensors.

21. The method of claim 1, wherein the sensor array includes four sensors positioned at points of a tetrahedron, and further comprising:
assigning a first sensor of the four sensors as a pivot; and
generating a virtual sensor with two plane rotations via linear interpolation between second, third and fourth sensors of the four sensors.

22. The method of claim 1, wherein the sensor array includes a plurality of sensors, and further comprising:
assigning a first sensor of the plurality of sensors as a pivot; and
generating a virtual sensor via linear interpolation between a remainder of the plurality of sensors.

23. The method of claim 1, further comprising:
generating a plurality of flux phase patterns, including the at least one flux phase pattern, based on the plurality of flux signals, each of the plurality of flux phase patterns representing a phase of a respective one of the plurality of flux signals.

24. The method of claim 1, further comprising generating the flux beam as a function of at least one flux phase pattern, the at least one flux phase pattern representing a phase of a respective one of the plurality of flux patterns.

25. The method of claim 1, wherein the sensor array includes at least one of an electric field sensor, a magnetic loop antenna, a hall effect sensor, and a flux gate sensor.

26. The method of claim 1, wherein the plurality of flux signals are magnetic fluxes, and wherein the magnetic fluxes are based on a spatial difference of two varying electric field signals detected by the sensor array.

27. The method of claim 1, further comprising:
detecting an external signal propagated outside of the flux beam;
determining a frequency of the external signal; and
reducing a magnitude of signals detected within the flux beam that match the frequency.

28. The method of claim 1, wherein generating the flux beam includes at least one of individually rotating and scaling at least one of the plurality of flux magnitude patterns.

29. An apparatus comprising:
a sensor array comprising a plurality of sensors, the sensor array configured to detect a plurality of flux signals, the plurality of flux signals being synchronous and each representing a surface integral of a vector field of one of an electromagnetic flux and a sound flux; and
a signal processor configured to:
generate a plurality of flux patterns based on the plurality of flux signals, each of the plurality of flux patterns representing a respective one of the plurality of flux signals;
generate a plurality of flux magnitude patterns based on the plurality of flux patterns, each of the plurality of flux magnitude patterns representing an absolute value of a respective one of the plurality of flux patterns; and generate a flux beam as a function of the plurality of flux magnitude patterns.

30. The apparatus of claim 29, wherein the flux beam is a function of at least one flux phase pattern, the at least one flux phase pattern representing a phase of a respective one of the plurality of flux patterns.

31. The apparatus of claim 29, wherein the signal processor is further configured to:

generate a plurality of flux phase patterns based on the plurality of flux signals, each of the plurality of flux phase patterns representing a phase of a respective one of the plurality of flux signals; and generate the flux beam as a function of the plurality of flux phase pattern.

\* \* \* \* \*